United States Patent
Dan

(10) Patent No.: US 11,006,531 B1
(45) Date of Patent: May 11, 2021

(54) METHOD FOR MANUFACTURING FLEXIBLE PRINTED CIRCUIT BOARD AND FLEXIBLE PRINTED CIRCUIT BOARD MANUFACTURED BY SAME

(71) Applicant: AMOGREENTECH CO., LTD., Gimpo-si (KR)

(72) Inventor: Sung-Baek Dan, Hwaseong-si (KR)

(73) Assignee: AMOGREENTECH CO., LTD., Gimpo-si (KR)

( * ) Notice: Subject to any disclaimer, the term of this patent is extended or adjusted under 35 U.S.C. 154(b) by 10 days.

(21) Appl. No.: 16/618,067

(22) PCT Filed: May 16, 2018

(86) PCT No.: PCT/KR2018/005637
§ 371 (c)(1),
(2) Date: Nov. 27, 2019

(87) PCT Pub. No.: WO2018/221876
PCT Pub. Date: Dec. 6, 2018

(30) Foreign Application Priority Data

May 30, 2017 (KR) .......................... 10-2017-0067101
May 30, 2017 (KR) .......................... 10-2017-0067102
May 30, 2017 (KR) .......................... 10-2017-0067103

(51) Int. Cl.
*H05K 3/46* (2006.01)
*H05K 3/28* (2006.01)
(Continued)

(52) U.S. Cl.
CPC ............. *H05K 3/467* (2013.01); *H05K 1/024* (2013.01); *H05K 3/0047* (2013.01); *H05K 3/28* (2013.01);
(Continued)

(58) Field of Classification Search
CPC ........ H05K 3/467; H05K 3/28; H05K 3/0047; H05K 3/386; H05K 1/024; H05K 2201/0158; H05K 2201/0154
(Continued)

(56) References Cited

U.S. PATENT DOCUMENTS 3,936,575 A * 2/1976 Watanabe ............ H05K 1/0326
428/417
6,461,527 B1 * 10/2002 Haupt .................. H05K 3/0035
216/17
(Continued)

FOREIGN PATENT DOCUMENTS

EP      0 374 272 A1   6/1990
JP      2003-258438 A  9/2003
(Continued)

OTHER PUBLICATIONS

KR Notification of Reason for Refusal dated Jun. 27, 2019 as received in Application No. 10-2017-0067102.
(Continued)

*Primary Examiner* — Sherman Ng
(74) *Attorney, Agent, or Firm* — Maschoff Brennan

(57) ABSTRACT

A method for manufacturing a flexible printed circuit board in which base sheets composed of Teflon film having heat resistance and low dielectric constant are stacked to prevent loss of a high frequency signal while minimizing dielectric loss due to the high frequency signal and a flexible printed circuit board manufactured by the same are disclosed. The proposed method for manufacturing a flexible printed circuit board comprises a step of preparing a base sheet which is a Teflon film having a thin film pattern formed on one surface thereof, a step of preparing an adhesive sheet, a step of stacking a plurality of base sheets and adhesive sheets, and a step of heating, pressing, and adhering a stacked body in
(Continued)

which the plurality of base sheets and adhesive sheets are stacked.

19 Claims, 29 Drawing Sheets

(51) Int. Cl.
*H05K 3/38* (2006.01)
*H05K 1/02* (2006.01)
*H05K 3/00* (2006.01)

(52) U.S. Cl.
CPC ..... *H05K 3/386* (2013.01); *H05K 2201/0154* (2013.01); *H05K 2201/0158* (2013.01)

(58) Field of Classification Search
USPC .......................................................... 174/254
See application file for complete search history.

(56) References Cited

U.S. PATENT DOCUMENTS

2010/0018638 A1* 1/2010 Zhang .................. H05K 3/0097
156/182
2010/0326712 A1* 12/2010 Kondo ................. H05K 3/4635
174/257
2017/0188451 A1* 6/2017 Hu ........................ H05K 1/0219

FOREIGN PATENT DOCUMENTS

| | | |
|---|---|---|
| JP | 2007-223101 A | 9/2007 |
| JP | 2015-096326 A | 5/2015 |
| KR | 10-2001-0050995 A | 6/2001 |
| KR | 10-0567095 B1 | 3/2006 |
| KR | 10-2007-0065196 A | 6/2007 |
| KR | 10-2011-0036362 A | 4/2011 |
| KR | 10-1138109 B1 | 4/2012 |
| KR | 10-2014-0014663 A | 2/2014 |
| KR | 10-1418867 B1 | 8/2014 |

OTHER PUBLICATIONS

KR Notification of Reason for Refusal dated Aug. 21, 2019 as received in Application No. 10-2017-0067101.
KR Notification of Reason for Refusal dated Aug. 21, 2019 as received in Application No. 10-2017-0067103.

* cited by examiner

METHOD FOR MANUFACTURING FLEXIBLE PRINTED CIRCUIT BOARD AND FLEXIBLE PRINTED CIRCUIT BOARD MANUFACTURED BY SAME

TECHNICAL FIELD

The present disclosure relates to a method for manufacturing a flexible printed circuit board and the flexible printed circuit board manufactured by the same, and more particularly, to a method for manufacturing a flexible printed circuit board having heat resistance and flexibility and the flexible printed circuit board manufactured by the same.

BACKGROUND ART

In general, a printed circuit board is a board that may be flexibly bent by forming a circuit pattern on a thin insulating film, and is widely used in a portable electronic device and an automation device or a display product requiring bending and flexibility when mounted and used.

In general, the printed circuit board is manufactured by bonding or die-casting a copper foil to a polyimide (PI) film. At this time, since the polyimide film has characteristics such as high mechanical strength, heat resistance, insulation, and solvent resistance, it is much used as a base material of a printed circuit board.

Meanwhile, as the use of services for transmitting large amounts of information in real time, such as a video call, movie watching, and real-time relay, increases, a portable terminal is mounted with circuits for transmitting large amounts of information by using a high frequency band (for example, GHz).

However, in the case of transmitting a high frequency signal by using a printed circuit board made of a polyimide film, there is a problem in that a signal loss of the high frequency signal occurs due to the dielectric loss inherent in the material.

In other words, there is a problem in that the polyimide film has a high dielectric constant, dielectric loss occurs at transmission and reception of the high frequency signal, such that loss of the high frequency signal occurs, thereby occurring disconnection when using services such as a video call, movie watching, and real-time relay.

Further, there is a problem in that a printed circuit board made of a film having low dielectric constant may minimize the loss of the high frequency signal, but has a low melting temperature to degrade heat resistance, such that a surface is melted by a high temperature of about 250° C. generated in a Surface Mount Technology (SMT) process for mounting a device for a high frequency, thereby causing defects.

Further, there is a problem in that the low dielectric constant and the high heat resistance film are formed at a high price, such that the manufacturing cost of the printed circuit board increases, thereby losing the competitiveness in the market.

DISCLOSURE

Technical Problem

The present disclosure is intended to solve the above conventional problems, and an object of the present disclosure is to provide a method for manufacturing a flexible printed circuit board and the flexible printed circuit board manufactured by the same, which stacks base sheets made of a Teflon film of heat resistance and low dielectric constant, thereby preventing loss of a high frequency signal while minimizing dielectric loss caused by the high frequency signal.

In other words, an object of the present disclosure is to provide a method for manufacturing a flexible printed circuit board and the flexible printed circuit board manufactured by the same, which constitutes a base sheet by forming a circuit pattern on a Teflon base material having excellent heat resistance and dielectric properties, and stacking a plurality of base sheets, thereby forming high heat resistance and low dielectric constant properties.

Further, another object of the present disclosure is to provide a method for manufacturing a flexible printed circuit board and the flexible printed circuit board manufactured by the same, which may reform the surface of a Teflon film, thereby manufacturing a multi-layer flexible printed circuit board by using the Teflon film.

Further, still another object of the present disclosure is to provide a method for manufacturing a flexible printed circuit board and the flexible printed circuit board manufactured by the same, which may form an adhesive layer of a Teflon material on a base sheet, which is a Teflon film, thereby manufacturing a multi-layer flexible printed circuit board.

In other words, still another object of the present disclosure is to provide a method for manufacturing a flexible printed circuit board and the flexible printed circuit board manufactured by the same, which may form a coating adhesive layer on a surface of a Teflon film in an impregnation coating or printing method, and heat, press, and adhere the stacked Teflon films, thereby manufacturing a multi-layer flexible printed circuit board.

Technical Solution

For achieving the objects, a method for manufacturing a flexible printed circuit board according to an embodiment of the present disclosure includes preparing a base sheet, which is a Teflon film having a thin film pattern formed thereon, stacking a plurality of base sheets, and heating, pressing, and adhering a stacked body in which the plurality of base sheets have been stacked. At this time, the preparing the base sheet may prepare the Teflon film having a surface reformed layer or an adhesive layer of a Teflon material formed thereon as the base sheet.

For achieving the objects, a flexible printed circuit board according to an embodiment of the present disclosure includes a stacked body in which a plurality of base sheets have been stacked and a circuit pattern formed on the stacked body, and the base sheet includes a Teflon film having a thin film pattern formed thereon. At this time, the Teflon film may have an adhesive layer or a surface reformed layer formed thereon.

Advantageous Effects

According to the present disclosure, the method for manufacturing the flexible printed circuit board and the flexible printed circuit board manufactured by the same may stack the plurality of base sheets having high heat resistance and low dielectric constant, thereby minimizing the dielectric loss due to the high frequency signal, and preventing the loss of the high frequency signal.

Further, the method for manufacturing the flexible printed circuit board and the flexible printed circuit board manufactured by the same may stack the base sheets made of the Teflon film having the heat resistant and the low dielectric constant to form the dielectric constant lower than the conventional flexible printed circuit board constituting the base sheet by using the polyimide or polypropylene film, thereby manufacturing the flexible printed circuit board that has minimized the dielectric loss.

Further, the method for manufacturing the flexible printed circuit board and the flexible printed circuit board manufactured by the same may constitute the base sheet with the Teflon sheet to improve reliability, thereby preventing deformation and breakage of the flexible printed circuit board due to the heat (about 250° C.) applied in the reflow process.

Further, the method for manufacturing the flexible printed circuit board and the flexible printed circuit board manufactured by the same may constitute the base sheet with the Teflon sheet, thereby manufacturing the flexible printed circuit board having high heat resistance and low dielectric constant properties.

Further, the method for manufacturing the flexible printed circuit board and the flexible printed circuit board manufactured by the same may form the base sheet by adhering the guide film to the Teflon film, thereby preventing the shape of the Teflon film from being deformed or broken in the manufacturing process to prevent the manufacturing yield and reliability of the flexible printed circuit board from being degraded.

Further, the method for manufacturing the flexible printed circuit board and the flexible printed circuit board manufactured by the same may stack the plurality of base sheets and adhesive sheets by forming the guide hole in the base sheet and the adhesive sheet and disposing so that the guide pin formed on the jig penetrates the guide hole formed in the base sheet and the adhesive sheet and then moving them downwards not to perform the alignment process of the stacked base materials (in other words, the base sheet and the adhesive sheet) in the stacking process, thereby simplifying the manufacturing process.

Further, the method for manufacturing the flexible printed circuit board and the flexible printed circuit board manufactured by the same may stack the plurality of base sheets and adhesive sheets by disposing so that the guide pin formed on the jig penetrates the guide hole formed in the base sheet and the adhesive sheet and then moving them downwards to align the thin film patterns formed on the stacked base sheets at accurate locations, thereby preventing the manufacturing yield and reliability of the flexible printed circuit board from being degraded.

Further, the method for manufacturing the flexible printed circuit board and the flexible printed circuit board manufactured by the same may form the surface reformed layer, which is ceramic or oxide, on the surface of the Teflon film to improve the adhesive property of the surface of the Teflon film, thereby manufacturing the multi-layer flexible printed circuit board by using the Teflon film having a difficult-to-adhere property.

Further, the method for manufacturing the flexible printed circuit board and the flexible printed circuit board manufactured by the same may form the surface reformed layer, which is ceramic or oxide, on the surface of the Teflon film to improve the adhesive property of the Teflon film, thereby adhering the Teflon film with the adhesive sheets of various materials.

Further, the method for manufacturing the flexible printed circuit board and the flexible printed circuit board manufactured by the same may form the surface reformed layer, which is ceramic or oxide, on the surface of the Teflon film to use the adhesive sheets of various materials, thereby minimizing the manufacturing cost of the flexible printed circuit board.

Further, the method for manufacturing the flexible printed circuit board and the flexible printed circuit board manufactured by the same may form the adhesive layer including the Teflon slurry on the surface of the Teflon film to improve the adhesive property of the surface of the Teflon film, thereby manufacturing the multi-layer flexible printed circuit board by using the Teflon film having a difficult-to-adhere property.

BEST MODE

Figure 1:
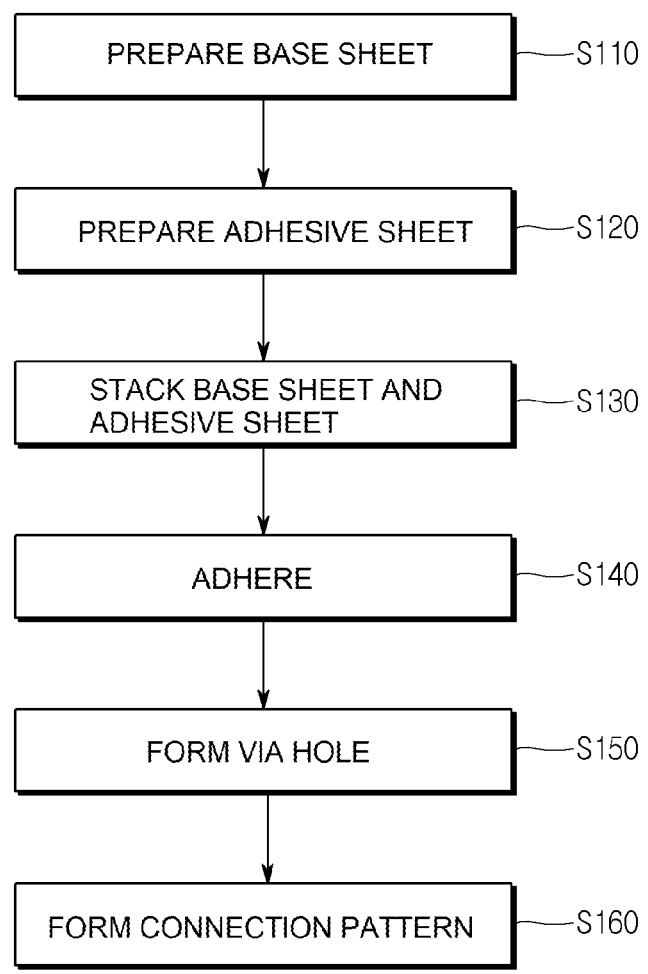
FIGS. 1 and 2 are diagrams for explaining a method for manufacturing a flexible printed circuit board according to a first embodiment of the present disclosure.

Hereinafter, the most preferred embodiments of the present disclosure will be described in detail with reference to the accompanying drawings so that those skilled in the art to which the present disclosure pertains may easily carry out the technical spirit of the present disclosure. First, in adding reference numerals to the components of each drawing, it should be noted that the same components have the same reference numerals as much as possible even if they are displayed on different drawings. In addition, in describing the present disclosure, when it is determined that the detailed description of the related well-known configuration or function may obscure the gist of the present disclosure, the detailed description thereof will be omitted.

Figure 2:
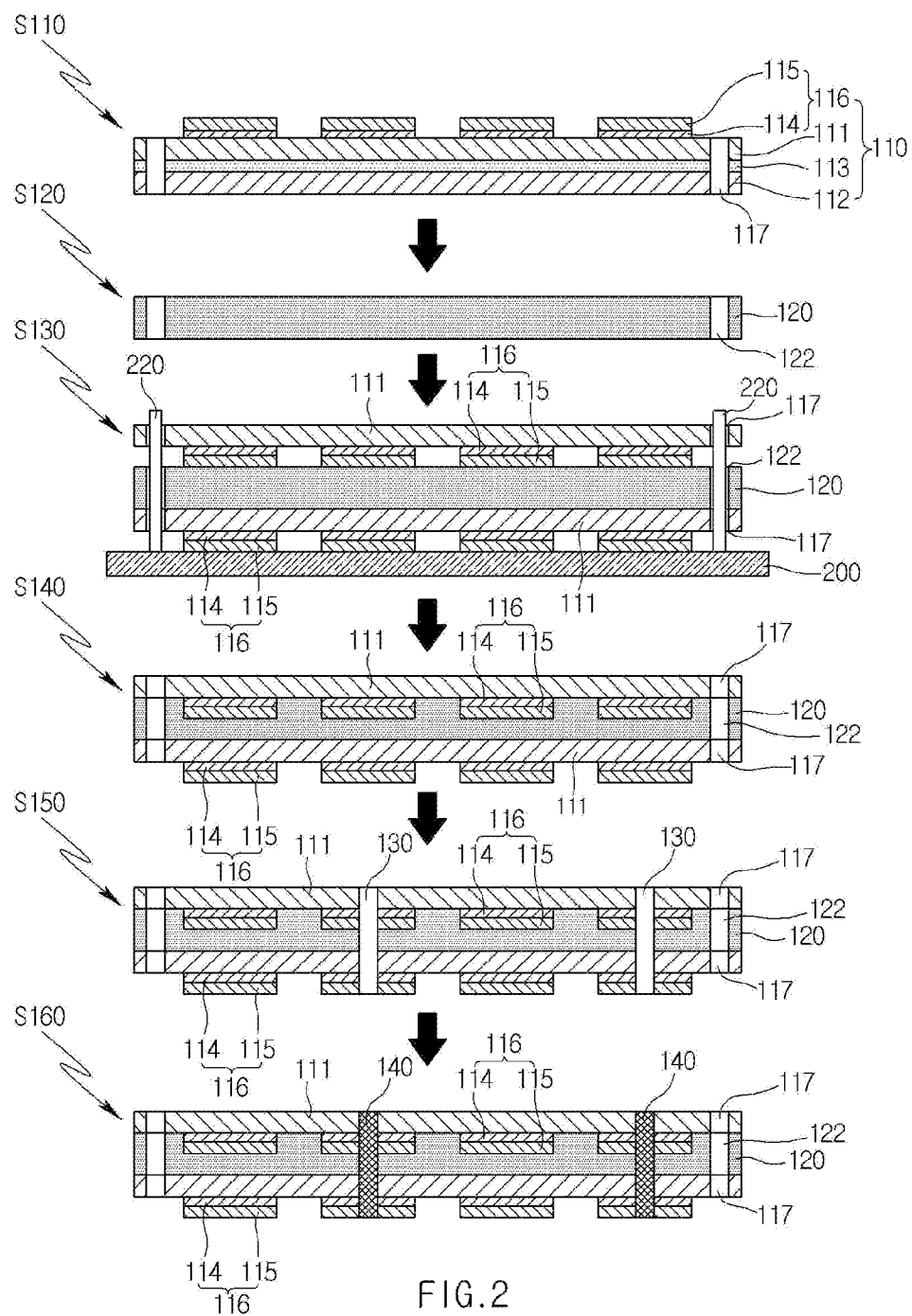

Referring to FIGS. 1 and 2, a method for manufacturing a flexible printed circuit board according to a first embodiment of the present disclosure includes preparing a base sheet (S110), preparing an adhesive sheet (S120), stacking (S130), adhering (S140), forming a via hole (S150), and forming a connection pattern (S160).

The preparing the base sheet (S110) prepares the base sheet 110 on which a guide film 112, a Teflon film 111, and a thin film pattern 116 are sequentially stacked, and in which a guide hole penetrating the guide film 112 and the Teflon film 111 is formed. At this time, a guide pin 220 of a jig 200 is inserted into the guide hole in order to easily perform the stacking (S130) to be described later.

Figure 3:
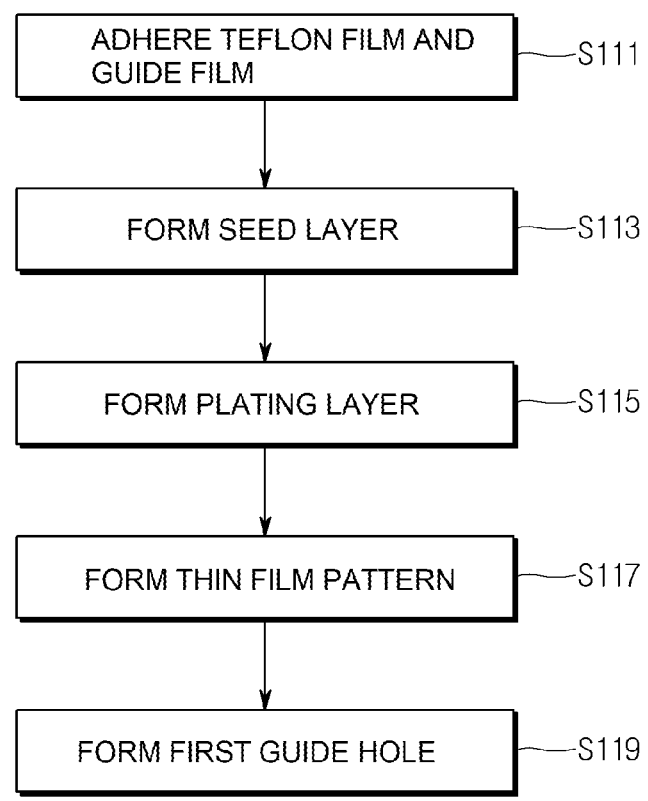
FIGS. 3 and 4 are diagrams for explaining the preparing the base sheet of FIG. 1.
Figure 4:
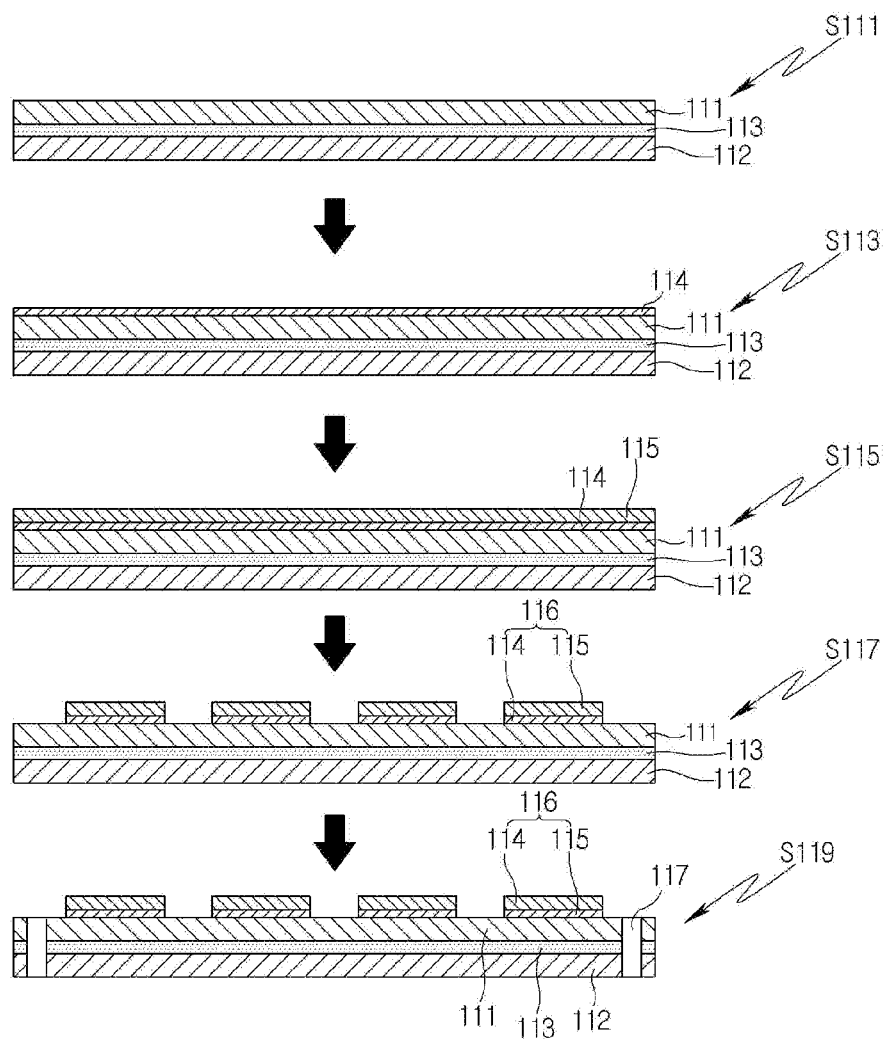

Referring to FIGS. 3 and 4, the preparing the base sheet (S110) includes adhering the Teflon film and the guide film (S111), forming a seed layer (S113), forming a plating layer (S115), forming a thin film pattern (S117), and forming a first guide hole (S119).

The adhering the Teflon film and the guide film (S111) prepares the Teflon film 111 of heat resistance and low dielectric constant. In other words, a flexible printed circuit board has been completely manufactured and then is mounted with a semiconductor element through a surface mount technology process (in other words, an SMT process).

At this time, there is a problem in that a flexible printed circuit board for a high frequency under development constitutes the base sheet 110 by using the polypropylene having heat resistance of about 160° C. to 180° C., such that the base sheet 110 is deformed or broken due to the heat (about 250° C.) applied in a reflow process of the surface mount technology process.

In order to prevent the reliability of the flexible printed circuit board from being degraded if the base sheet 110 is deformed or broken, the method for manufacturing the flexible printed circuit board according to an embodiment of the present disclosure constitutes the base sheet 110 by using the Teflon film 111.

At this time, since the Teflon film 111 is not deformed even in the heat of about 300° C., deformation and breakage of the base sheet due to the heat applied in the reflow process may be prevented.

Accordingly, the adhering the Teflon film and the guide film (S111) constitutes the base sheet 110 by using the Teflon film 111.

As a result, the method for manufacturing the flexible printed circuit board and the flexible printed circuit board manufactured by the same may prevent deformation and breakage of the flexible printed circuit board due to the heat (about 250° C.) applied in the reflow process, thereby improving reliability.

The Teflon is mainly used as lubricant, release material, and insulation material. Since the Teflon has the best heat resistance and dielectric properties (in other words, low dielectric constant) among polymer materials, it is used as a base material of a printed circuit board for a high frequency requiring low dielectric constant and heat resistance.

However, since the Teflon is soft-melting and thermoplastic, the base material is deformed by heat and pressure applied in the manufacturing process, thereby causing a high defective rate. Accordingly, the Teflon is mainly used as a thick hard-type single-sided or double-sided base material.

In an embodiment of the present disclosure, the Teflon film 111 of a thin film is used as the base sheet 110 in order to manufacture the flexible printed circuit board. The Teflon film 111 is deformed or broken in a shape even at a small pressure applied in the manufacturing process due to the soft-melting property, thereby degrading the manufacturing yield and reliability of the flexible printed circuit board.

Accordingly, the adhering the Teflon film and the guide film (S111) adheres the guide film 112 to one surface of the Teflon film 111 in order to prevent deformation and breakage of the Teflon film 111 in the manufacturing process.

At this time, the guide film 112 is, for example, a hard polyethylene terephthalate (PET) film.

The adhering the Teflon film and the guide film (S111) adheres the Teflon film 111 and the guide film 112 by interposing an adhesive sheet 113 between the Teflon film 111 and the guide film 112. In other words, since the guide film 112 should be removed in the stacking (S130) to be described later, the adhering the Teflon film and the guide film (S111) couples the Teflon film 111 and the guide film 112 in an adhering state (in other words, the adhesive sheet 113) capable of being easily removed while supporting the Teflon film 111. Here, the adhesive sheet 113 is, for example, a silicone (Si)-based adhesive agent.

As described above, the method for manufacturing the flexible printed circuit board according to an embodiment of the present disclosure may form the base sheet 110 by adhering the guide film 112 to the Teflon film 111, thereby preventing the shape of the Teflon film 111 from being deformed or broken in the manufacturing process to prevent the manufacturing yield and reliability of the flexible printed circuit board from being degraded.

The forming the seed layer (S113) forms a seed layer 114 of a thin film on one surface of the Teflon film 111. The forming the seed layer (S113) forms the seed layer 114 on the other surface (in other words, the surface opposite to one surface on which the guide film 112 has been adhered) of the Teflon film 111 through a deposition process or a sputtering process. Here, the forming the seed layer (S113) forms the seed layer 114 of a mixed material of mixing nickel copper (NiCu) and copper (Cu) or a nickel copper (NiCu) material on the other surface of the Teflon film 111.

The forming the plating layer (S115) forms a plating layer 115 on the seed layer 114. At this time, the forming the plating layer (S115) forms the plating layer 115 on the seed layer 114 by electroplating copper (Cu).

Here, the seed layer 114 and the plating layer 115 are elements constituting a circuit pattern, and are formed at a thickness of about 5 μm.

The forming the thin film pattern (S117) forms a thin film pattern 116 on the other surface of the Teflon film 111. In other words, the forming the thin film pattern (S117) forms the thin film pattern 116 of a predetermined shape by removing parts of the seed layer 114 and the plating layer 115 formed on the other surface of the Teflon film 111 through an etching process.

The forming the first guide hole (S119) forms a plurality of first guide holes 117 penetrating the Teflon film 111 and the guide film 112. In other words, the forming the first guide hole (S119) forms the plurality of first guide holes 117 in order to align the base sheets 110 at accurate locations while firmly fixing the base sheet 110 to the jig 200 in the stacking (S130) to be described later. Here, the forming the first guide hole (S119) forms the first guide hole 117 in the base sheet 110 through a punching process, a laser drill process, or the like.

The preparing the adhesive sheet (S120) prepares an adhesive sheet 120 in which a plurality of second guide holes 122 have been formed. At this time, the preparing the adhesive sheet (S120) forms the second guide hole 122 at a location corresponding to the first guide hole 117 at the time of stacking the base sheet 110 and the adhesive sheet 120.

The preparing the adhesive sheet (S120) may prepare the adhesive sheet 120 of a multi-layer structure having an adhesive layer formed on one surface or both surfaces of the film base material.

For example, the adhesive sheet 120 may be a Casted polypropylene (CPP) film of low dielectric constant having a low dielectric loss. At this time, the CPP film is formed in a multi-layer structure having the adhesive layer formed on one surface or both surfaces of a polypropylene (PP) film (hereinafter, a PP film).

Here, the adhesive layer may be made of a composite material of mixing the same material as the CPP film (for example, a material of polyethylene (PE), polypropylene (PP), polyimide, or the like) and an additive (for example, acrylate, or the like) in order to increase an adhesive force between polymer (in other words, the Teflon film 111 of the base sheet 110) and the metal (in other words, the thin film pattern 116).

The preparing the adhesive sheet (S120) may also prepare the adhesive sheet 120 of a single layer structure.

At this time, the preparing the adhesive sheet (S120) is, for example, to prepare the adhesive sheet 120 made of a composite material of mixing a material such as polyethylene, polypropylene, or polyimide with an additive, which has an excellent adhesive property with polymer and metal.

The preparing the adhesive sheet (S120) may also prepare the adhesive sheet 120 of a Teflon material.

The stacking (S130) stacks the plurality of base sheets 110 and the adhesive sheet 120. At this time, the stacking (S130) interposes the adhesive sheet 120 between the base sheets 110 by alternately stacking the base sheet 110 and the adhesive sheet 120.

The stacking (S130) stacks the plurality of base sheets 110 and the adhesive sheet 120 by using the jig 200. In other words, the stacking (S130) may provide reliability of the flexible printed circuit board only when the thin film patterns 116 of the base sheet 110 are stacked to be aligned at accurate locations.

Accordingly, the stacking (S130) stacks the plurality of base sheets 110 and the adhesive sheet 120 by using the jig 200 including the guide pin 220.

Figure 5:
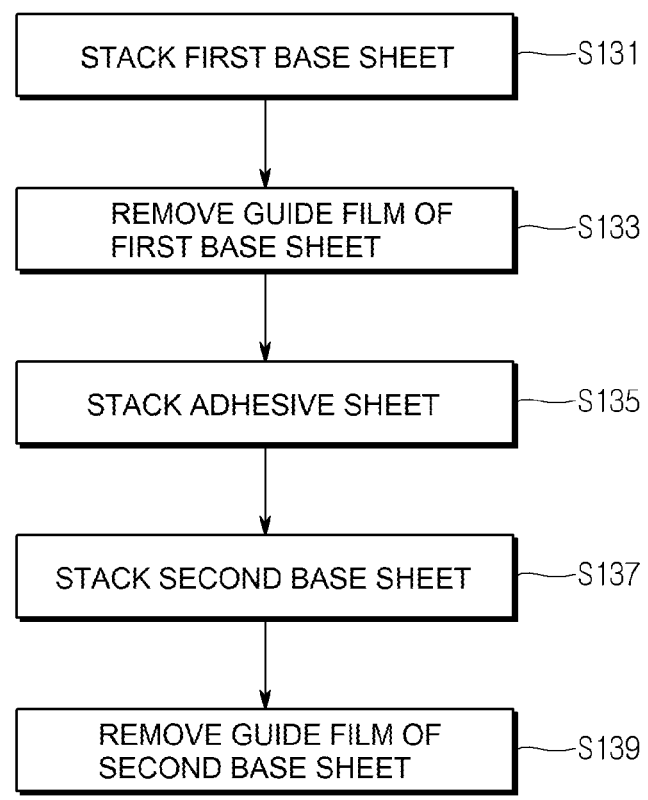
FIGS. 5 and 6 are diagrams for explaining the stacking the base sheet and the adhesive sheet of FIG. 1.
Figure 6:
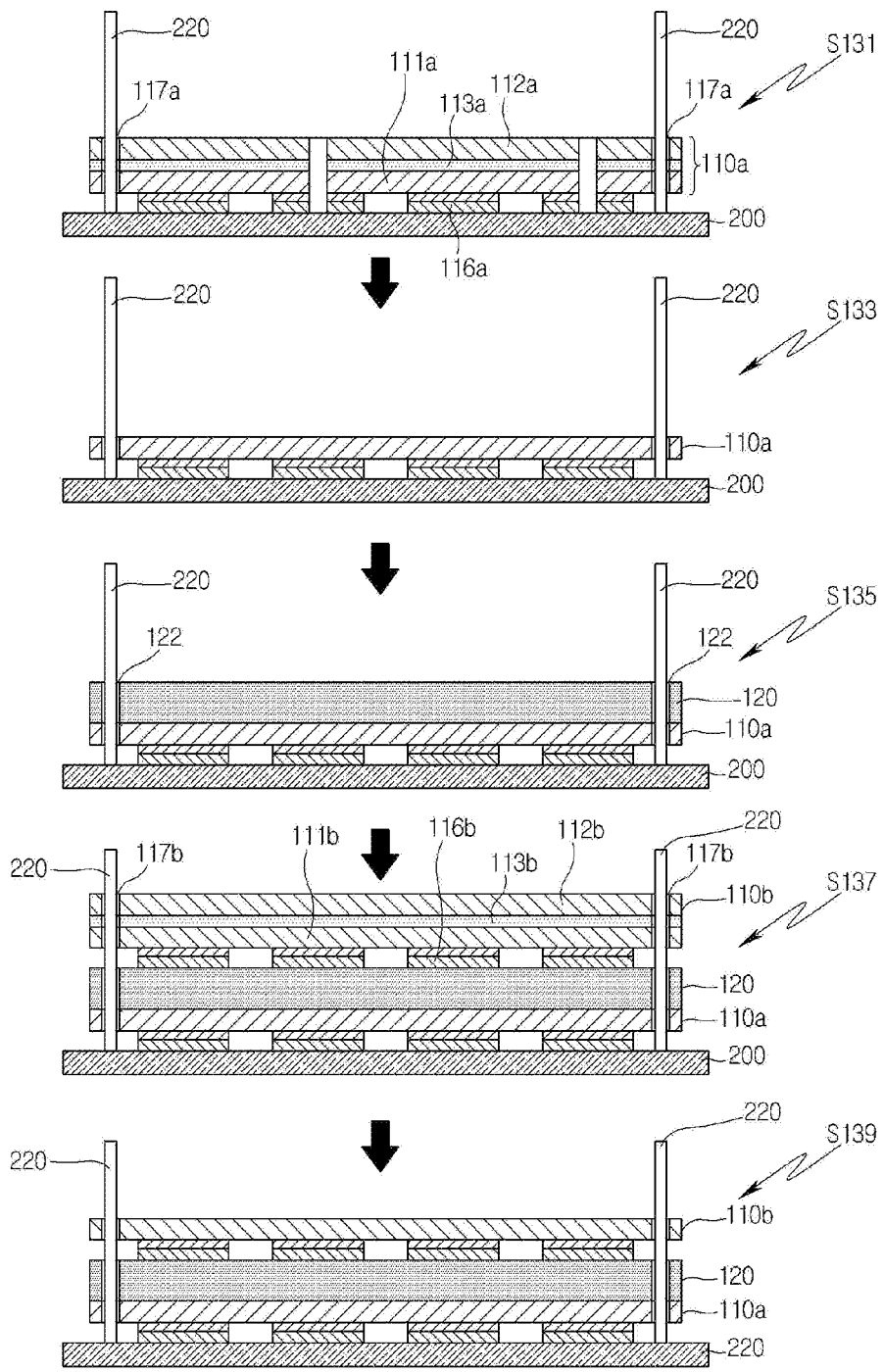

An example of the stacking (S130) that stacks two base sheets 110 (in other words, a first base sheet 110a and a second base sheet 110b) and the adhesive sheet 120 will be explained with reference to FIGS. 5 and 6 as follows.

The stacking (S130) includes stacking the first base sheet 110a (S131), removing the guide film 112a of the first base sheet 110a (S133), stacking the adhesive sheet 120 (S135), stacking the second base sheet 110b (S137), and removing a guide film 112b of the second base sheet 110b (S139).

The stacking the first base sheet 110a (S131) stacks the first base sheet 110a on the jig 200. In other words, the stacking the first base sheet 110a (S131) stacks the first base sheet 110a on the jig 200 by disposing so that the guide pins 220 of the jig 200 penetrate first guide holes 117a of the first base sheet 110a, respectively and then moving them downwards.

At this time, the stacking the first base sheet 110a (S131) stacks the first base sheet 110a so that a thin film pattern 116a formed on the first base sheet 110a is positioned downwards in order to easily remove the guide film 112a. In other words, the stacking the first base sheet 110a (S131) disposes the guide film 112a on the top by stacking the first base sheet 110a so that the thin film pattern 116a is positioned downwards.

The removing the guide film 112a of the first base sheet 110a (S133) removes the guide film 112a from the first base sheet 110a stacked on the jig 200. In other words, the removing the guide film 112a of the first base sheet 110a (S133) removes the guide film 112a of the first base sheet 110a disposed on the top and the adhesive film 113a.

The stacking the adhesive sheet 120 (S135) stacks the adhesive sheet 120 on the jig 200. In other words, the stacking the adhesive sheet 120 (S135) stacks the adhesive sheet 120 on the jig 200 by disposing so that the guide pins 220 of the jig 200 penetrate the second guide holes 122 of the adhesive sheet 120, respectively and then moving them downwards. At this time, the stacking the adhesive sheet 120 (S135) stacks the adhesive sheet 120 above the first base sheet 110a stacked on the jig 200.

The stacking the second base sheet 110b (S137) stacks the second base sheet 110b on the jig 200. In other words, the stacking the second base sheet 110b (S137) stacks the second base sheet 110b on the jig 200 by disposing so that the guide pins 220 of the jig 200 penetrate the first guide holes 117b of the second base sheet 110b, respectively and then moving them downwards.

At this time, the stacking the second base sheet 110b (S137) stacks the second base sheet 110b above the adhesive sheet 120 stacked on the jig 200. The stacking the second base sheet 110b (S137) stacks the second base sheet 110b so that one surface, on which the thin film pattern 116b has been formed, is disposed above the adhesive sheet 120.

The removing the guide film 112b of the second base sheet 110b (S139) removes the guide film 112b from the second base sheet 110b stacked on the jig 200. In other words, the removing the guide film 112b of the second base sheet 110b (S139) removes the guide film 112b of the second base sheet 110b disposed on the top and an adhesive film 113b.

As described above, the method for manufacturing the flexible printed circuit board may stack the plurality of base sheets 110 and the adhesive sheet 120 by disposing so that the guide pin 220 formed on the jig 200 penetrates the guide holes (in other words, the first guide hole 117 and the second guide hole 122) formed in the base sheet 110 and the adhesive sheet 120 and then moving them downwards in the stacking (S130) not to perform the alignment process of the stacked base materials (in other words, the base sheet 110 and the adhesive sheet 120) in the stacking process, thereby simplifying the manufacturing process.

Further, the method for manufacturing the flexible printed circuit board may stack the plurality of base sheets 110 and the adhesive sheet 120 by disposing so that the guide pin 220 formed on the jig 200 penetrates the guide holes (in other words, the first guide hole 117 and the second guide hole 122) formed in the base sheet 110 and the adhesive sheet 120 and then moving them downwards in the stacking (S130) to align the thin film patterns 116 formed on the stacked base sheets 110 at accurate locations, thereby preventing the manufacturing yield and reliability of the flexible printed circuit board from being degraded.

The adhering (S140) constitutes a stacked body by adhering the plurality of base sheets 110 and the adhesive sheet 120 stacked on the jig 200.

The adhering (S140) is, for example, to constitute the stacked body by compressing and preliminarily adhering the plurality of base sheets 110 and the adhesive sheet 120 and then mainly adhering the plurality of base sheets 110 and the adhesive sheet 120.

Here, the preliminary adhering is, for example, to compress the plurality of base sheets 110 and the adhesive sheet 120 stacked on the jig 200 through a Water Injection Molding (WIM) process that compresses it by applying a high water pressure.

The main adhering is, for example, to adhere the plurality of base sheets 110 and the adhesive sheet 120 preliminarily adhered through a hot press process applying a predetermined pressure and heat. At this time, the main adhering (in other words, the hot press process) adheres the plurality of base sheets 110 and the adhesive sheet 120 by applying a lower pressure than that in the preliminary adhering (in other words, the water injection molding process).

If the adhesive sheet 120 has been made of a Teflon material, the main adhering applies a pressure with a high temperature of about 300° C. or more.

The adhering (S140) constitutes the stacked body by completing the adhering of the plurality of base sheets 110 and the adhesive sheet 120, and separates the stacked body from the jig 200.

The forming the via hole (S150) forms one or more via holes 130 penetrating the stacked body. In other words, the forming the via hole (S150) forms the via hole 130 in the stacked body separated from the jig 200 through a punching process, a laser drill process, or the like.

Here, although it has been illustrated in FIGS. 1 and 2 that the plurality of base sheets 110 and the adhesive sheet 120 have been stacked and adhered to each other and then the via hole 130 is formed therein, it is not limited thereto and the respective base sheets 110 and the adhesive sheet 120 may also be stacked and adhered to each other after the via hole 130 has been formed therein.

The forming the connection pattern (S160) forms a connection pattern 140 in the via hole 130 in order to electrically connect (in other words, electrically conduct) the thin film patterns 116 formed on the plurality of base sheets 110, respectively. At this time, the forming the connection pattern (S160) forms the connection pattern 140 by filling a conductive material in the via hole 130. Here, the forming the connection pattern (S160) may also form the connection pattern 140 by electroplating a conductive material on the inner wall surface of the via hole 130 and the thin film pattern 116 exposed to the outside of the stacked body.

Meanwhile, the method for manufacturing the flexible printed circuit board may further include forming a protective layer on the upper surface of the stacked body configured by stacking the plurality of base sheets 110 and the adhesive sheets 120.

The forming the protective layer forms a protective layer covering the surfaces of the thin film pattern 116 and the base sheet 110 by applying and then curing a coating liquid on the surfaces of the base material and the thin film pattern 116 stacked on the uppermost portion of the stacked body. At this time, the protective layer may be made of a composite material containing a resin such as polypropylene and polyimide.

Further, the method for manufacturing the flexible printed circuit board may further include forming an electrode part. At this time, the forming the electrode part may form the electrode part by removing a part of the protective layer and then electroplating a conductive material such as copper on the corresponding area. Here, the electrode part may be formed on at least one of the plurality of thin film patterns 116 disposed on the upper surface of the stacked body.

Figure 7:
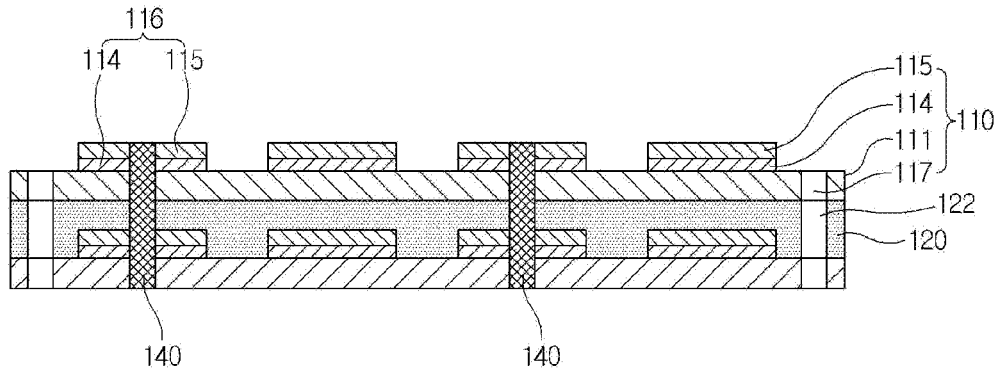
FIG. 7 is a diagram for explaining a flexible printed circuit board according to the first embodiment of the present disclosure.

Referring to FIG. 7, a printed circuit board manufactured by the method for manufacturing the flexible printed circuit board according to an embodiment of the present disclosure is configured to include a stacked body in which the plurality of base sheets 110 and the adhesive sheet 120 have been alternately stacked and then adhered to each other, and a circuit pattern formed in the stacked body and on the upper surface thereof.

As the stacked body is configured by alternately stacking the plurality of base sheets 110 and the adhesive sheet 120, the stacked body is configured by repeatedly stacking the Teflon film 111 and the adhesive sheet 120. At this time, the stacked body has the adhesive sheet 120 interposed between the Teflon films 111.

At this time, although it has been illustrated in FIG. 7 that the adhesive sheet 120 is configured in a single layer, it is not limited thereto and may also be configured in a multi-layer structure.

The circuit pattern is composed of the thin film pattern 116 exposed to the upper surface of the stacked body, the thin film pattern 116 interposed in the stacked body, and the connection pattern 140 electrically connecting them.

In other words, as the base sheets 110 are stacked, the circuit pattern has the thin film pattern 116, which has been formed on the base sheet 110 stacked on the uppermost portion thereof, exposed to the upper surface of the stacked body, and has the thin film patterns 116, which have been formed on other base sheets 110, interposed in the stacked body. At this time, the thin film patterns 116 are electrically connected (in other words, electrically conducted) through the connection pattern 140 formed in the via hole 130.

Here, although it has been illustrated in FIG. 7 that the connection pattern 140 is formed by being filled in the via hole 130, it is not limited thereto and may also be formed by being plated on the inner wall surface of the via hole 130.

Figure 8:
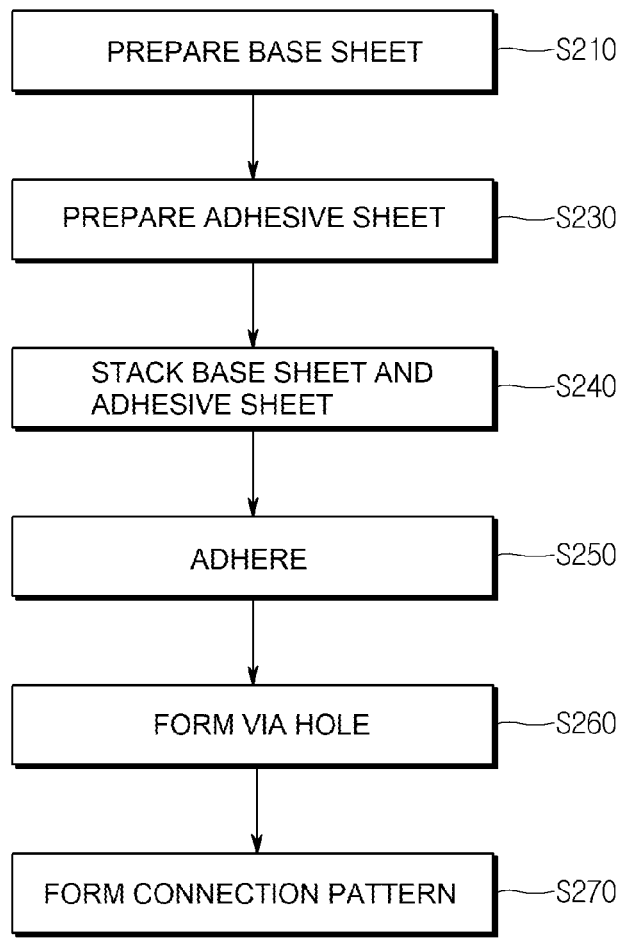
FIGS. 8 and 9 are diagrams for explaining a method for manufacturing a flexible printed circuit board according to a second embodiment of the present disclosure.
Figure 9:
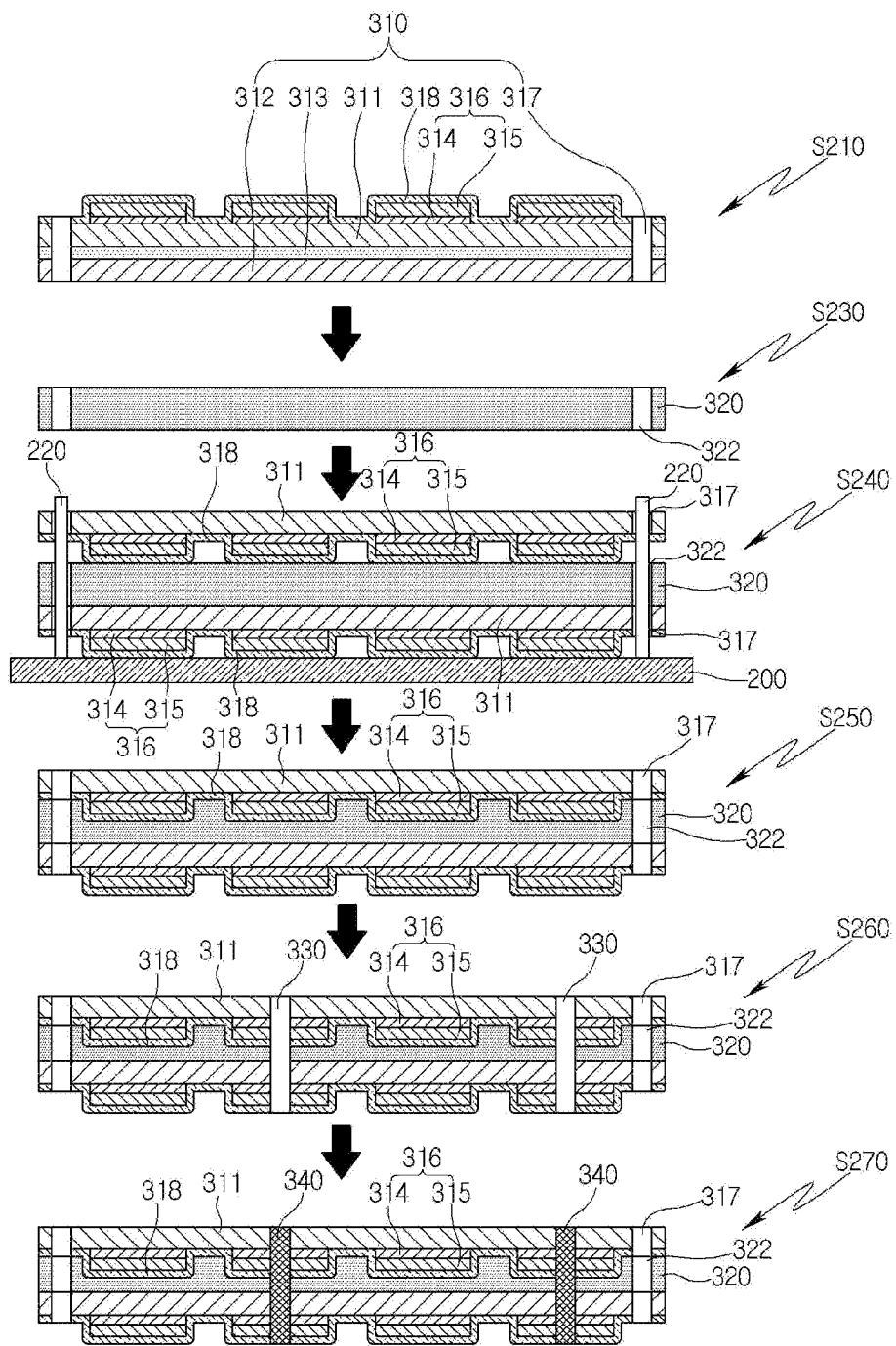

Referring to FIGS. 8 and 9, a method for manufacturing a flexible printed circuit board according to a second embodiment of the present disclosure includes preparing a base sheet (S210), preparing an adhesive sheet (S230), stacking (S240), adhering (S250), forming a via hole (S260), and forming a connection pattern (S270).

The preparing the base sheet (S210) prepares a base sheet 310 on which a guide film 312, a Teflon film 311, and a thin film pattern 316 are sequentially stacked, and in which a guide hole penetrating the guide film 312 and the Teflon film 311 is formed. At this time, the guide pin 220 of the jig 200 is inserted into the guide hole in order to easily perform the stacking (S240) to be described later.

The preparing the base sheet (S210) forms a surface reformed layer 318 on both surfaces (in other words, the upper surface and the lower surface) of the Teflon film in order to improve the adhesive property of the Teflon film. At this time, the preparing the base sheet (S210) may form the surface reformed layer 318 only on one surface, to which the adhesive sheet 320 is adhered, of the upper surface and the lower surface of the Teflon film. Here, the surface reformed layer 318 may be, for example, ceramic (for example, titanium dioxide ($TiO_2$)) or oxide having excellent adhesive property with the adhesive sheet 320 of various materials.

Figure 10:
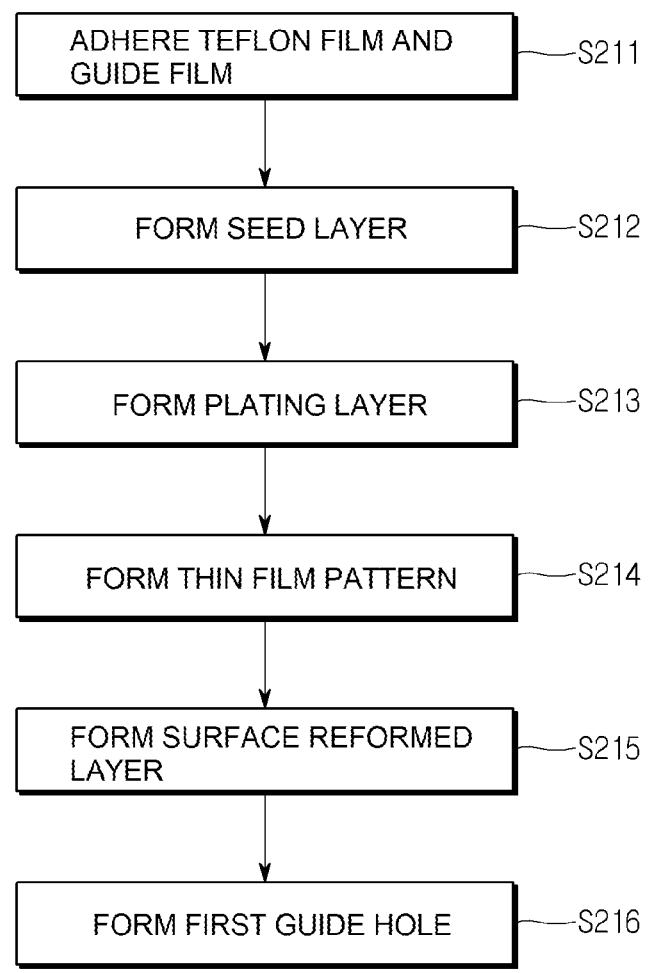
FIGS. 10 to 15 are diagrams for explaining the preparing the base sheet of FIG. 8.
Figure 11:
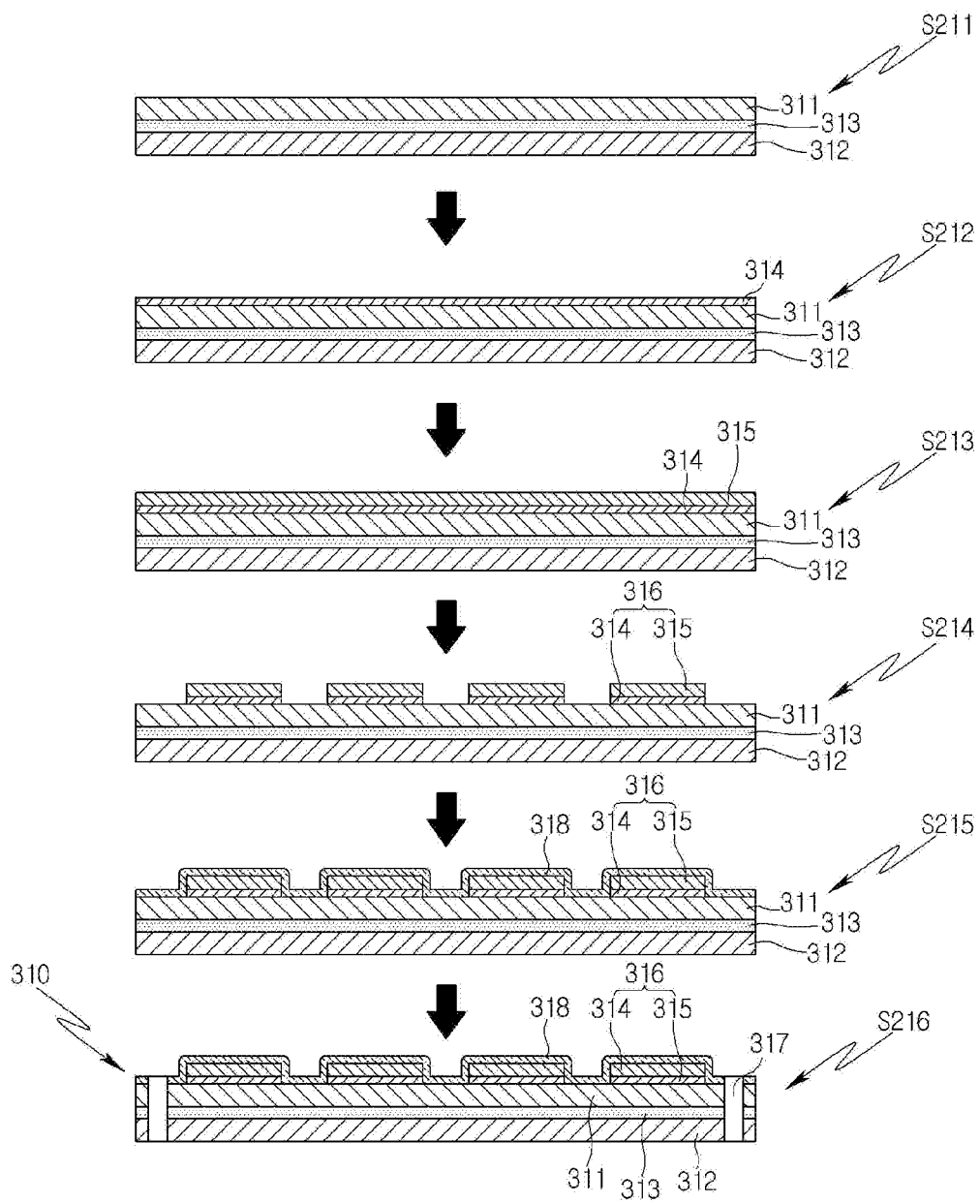

Referring to FIGS. 10 and 11, the preparing the base sheet (S210) forms the surface reformed layer 318 on one surface of the Teflon film 311. To this end, the preparing the base sheet (S210) includes adhering a Teflon film and a guide film (S211), forming a seed layer (S212), forming a plating layer (S213), forming a thin film pattern (S214), forming a surface reformed layer (S215), and forming a first guide hole (S216).

The adhering the Teflon film and the guide film (S211) prepares the Teflon film 311 of heat resistance and low dielectric constant. In other words, the flexible printed circuit board has been completely manufactured and then is mounted with a semiconductor element through a surface mount technology process (in other words, an SMT process).

At this time, there is a problem in that a flexible printed circuit board for a high frequency under development constitutes the base sheet 310 by using polypropylene having heat resistance of about 160° C. to 180° C., such that the base sheet 310 is deformed or broken due to the heat (about 250° C.) applied in the reflow process of the surface mount technology process.

In order to prevent the reliability of the flexible printed circuit board from being degraded if the base sheet 310 is deformed or broken, the method for manufacturing the flexible printed circuit board according to an embodiment of the present disclosure constitutes the base sheet 310 by using the Teflon film 311.

At this time, since the Teflon film 311 is not deformed even in the heat of about 300° C., deformation and breakage of the base sheet due to the heat applied in the reflow process may be prevented.

Accordingly, the adhering the Teflon film and the guide film (S211) constitutes the base sheet 310 by using the Teflon film 311.

As a result, the method for manufacturing the flexible printed circuit board and the flexible printed circuit board manufactured by the same may prevent deformation and breakage of the flexible printed circuit board due to the heat (about 250° C.) applied in the reflow process, thereby improving reliability.

The Teflon is mainly used as lubricant, release material, and insulation material. Since the Teflon has the best heat resistance and dielectric properties (in other words, low dielectric constant) among polymer materials, it is used as a base material of a flexible printed circuit board for a high frequency requiring low dielectric constant and heat resistance.

However, since the Teflon is soft-melting and thermoplastic, the base material is deformed by heat and pressure applied in the manufacturing process, thereby causing a high defective rate. Accordingly, the Teflon is mainly used as a thick hard-type single-sided or double-sided base material.

An embodiment of the present disclosure uses the Teflon film 311 of a thin film as the base sheet 310 in order to manufacture the flexible printed circuit board. The Teflon film 311 is deformed or broken in a shape even at a small pressure applied in the manufacturing process due to the soft-melting property, thereby degrading the manufacturing yield and reliability of the flexible printed circuit board.

Accordingly, the adhering the Teflon film and the guide film (S211) adheres the guide film 312 to one surface of the Teflon film 311 in order to prevent deformation and breakage of the Teflon film 311 in the manufacturing process.

At this time, the guide film 312 is, for example, a hard polyethylene terephthalate (PET) film.

The adhering the Teflon film and the guide film (S211) adheres the Teflon film 311 and the guide film 312 by interposing an adhesive sheet 313 between the Teflon film 311 and the guide film 312. In other words, since the guide film 312 should be removed in the stacking (S240) to be described later, the adhering the Teflon film and the guide film (S211) couples the Teflon film 311 and the guide film 312 in an adhering state (in other words, the adhesive sheet 313) capable of being easily removed while supporting the Teflon film 311. Here, the adhesive sheet 313 is, for example, a silicone (Si)-based adhesive agent.

As described above, the method for manufacturing the flexible printed circuit board according to an embodiment of the present disclosure may form the base sheet 310 by adhering the guide film 312 to the Teflon film 311, thereby preventing the shape of the Teflon film 311 from being deformed or broken in the manufacturing process to prevent the manufacturing yield and reliability of the flexible printed circuit board from being degraded.

The forming the seed layer (S212) forms a seed layer 314 of a thin film on one surface of the Teflon film 311. The forming the seed layer (S212) forms the seed layer 314 on the other surface (in other words, the surface opposite to one surface to which the guide film 312 has been adhered) of the Teflon film 311 through a deposition process or a sputtering process. Here, the forming the seed layer (S212) forms the seed layer 314 of a mixed material of mixing nickel copper (NiCu) and copper (Cu) or a nickel copper (NiCu) material on the other surface of the Teflon film 311.

The forming the plating layer (S213) forms a plating layer 315 on the seed layer 314. At this time, the forming the plating layer (S213) forms the plating layer 315 on the seed layer 314 by electroplating copper (Cu).

Here, the seed layer 314 and the plating layer 315 are elements constituting a circuit pattern, and are formed at a thickness of about 5 µm.

The forming the thin film pattern (S214) forms a thin film pattern 316 on the other surface of the Teflon film 311. In other words, the forming the thin film pattern (S214) forms the thin film pattern 316 of a predetermined shape by removing parts of the seed layer 314 and the plating layer 315 formed on the other surface of the Teflon film 311 through an etching process.

The forming the surface reformed layer (S215) forms a surface reformed layer 318 on one surface of the Teflon film 311. In other words, the forming the surface reformed layer (S215) forms the surface reformed layer 318 on one surface, on which the thin film pattern 316 has been formed, of both surfaces (in other words, the upper surface and the lower surface) of the Teflon film 311. At this time, the surface reformed layer 318 is formed on the upper surface and the periphery of the thin film pattern 316, and the upper surface of the Teflon film 311 exposed to the space between the thin film patterns 316.

The forming the surface reformed layer (S215) forms the surface reformed layer 318 by depositing ceramic or oxide on one surface of the Teflon film 311 through a sputter process, which is a vacuum deposition method. At this time, the surface reformed layer 318 is a material selected from ceramic, oxide, nitride, and carbonate having excellent adhesive property with the adhesive sheet 320, and the sputter process is, for example, an oxide sputtering process.

As described above, the method for manufacturing the flexible printed circuit board may form the surface reformed layer 318, which is ceramic or oxide, on the surface of the Teflon film to improve the adhesive property of the surface of the Teflon film, thereby manufacturing a multi-layer flexible printed circuit board by using the Teflon film having a difficult-to-adhere property, and to adhere the Teflon film with the adhesive sheet of various materials, thereby minimizing the manufacturing cost of the flexible printed circuit board.

The forming the first guide hole (S216) forms a plurality of first guide holes 317 penetrating the surface reformed layer 318, the Teflon film 311, and the guide film 312. In other words, the forming the first guide hole (S216) forms the plurality of first guide holes 317 in order to align the base sheets 310 at accurate locations while firmly fixing the base sheet 310 to the jig 200 in the stacking (S240) to be described later. Here, the forming the first guide hole (S216) forms the first guide hole 317 in the base sheet 310 through a punching process, a laser drill process, or the like.

Figure 12:
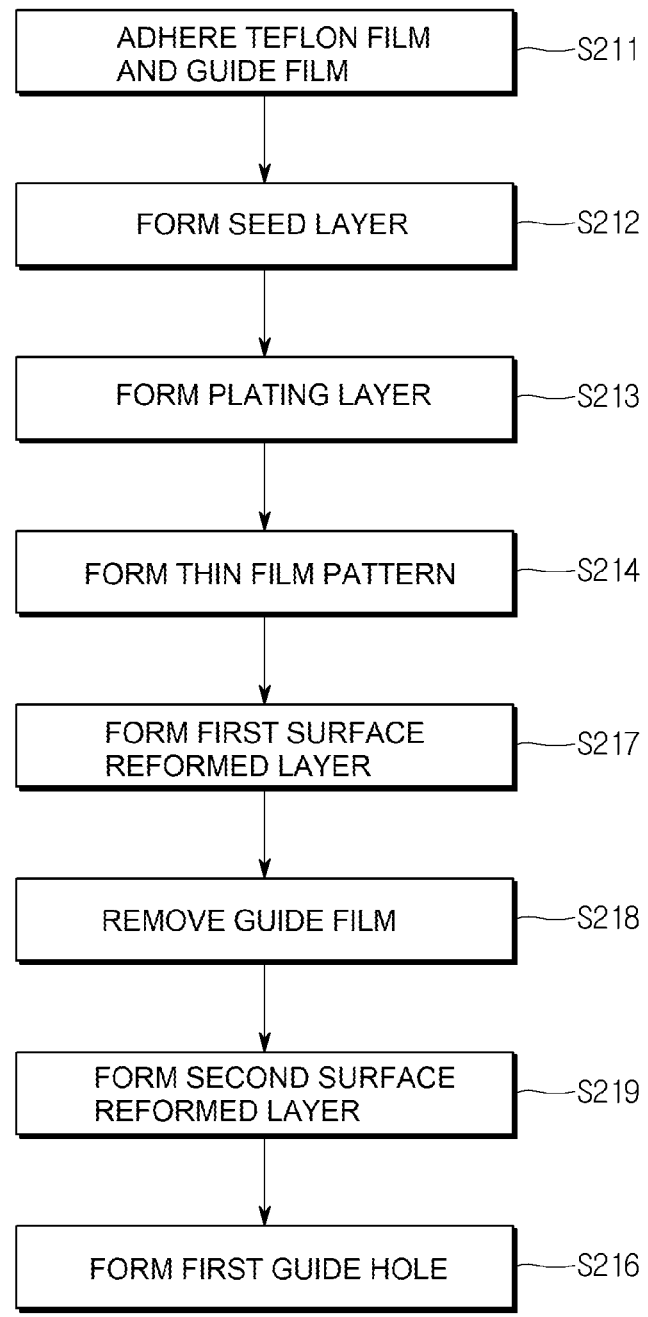
Figure 13:
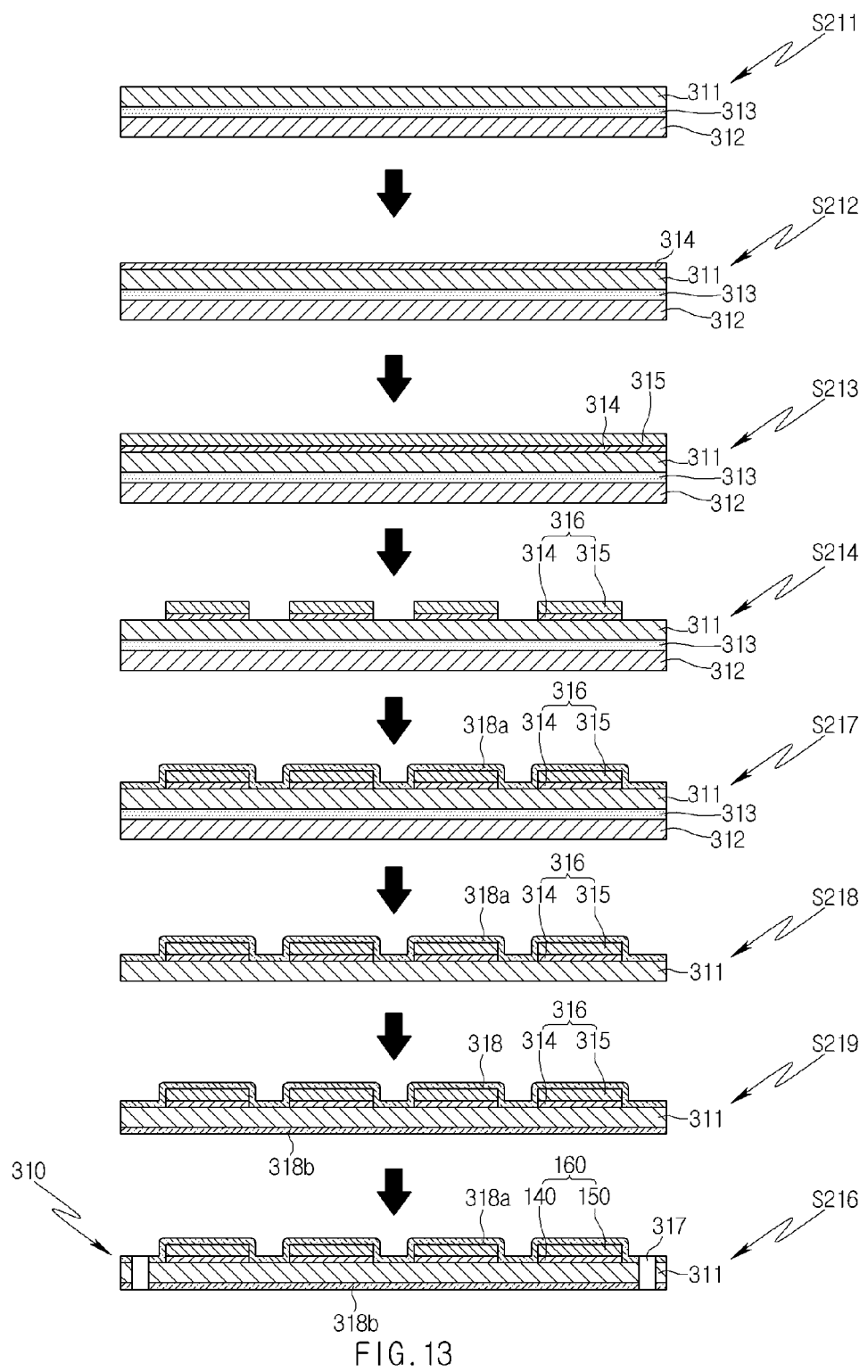

Referring to FIGS. 12 and 13, the forming the surface reformed layer (S215) may include forming a first surface reformed layer (S217), removing a guide film (S218), and forming a second surface reformed layer (S219).

The forming the first surface reformed layer (S217) forms a first surface reformed layer 318a on one surface of the Teflon film 311. In other words, the forming the first surface reformed layer (S217) forms the first surface reformed layer 318a on one surface, on which the thin film pattern 316 has been formed, of both surfaces (in other words, the upper surface and the lower surface) of the Teflon film 311. At this time, the first surface reformed layer 318a is formed on the upper surface and the periphery of the thin film pattern 316, and the upper surface of the Teflon film 311 exposed to the space between the thin film patterns 316.

The forming the first surface reformed layer (S217) forms the first surface reformed layer 318a by depositing ceramic or oxide on one surface of the Teflon film 311 through a sputter process, which is a vacuum deposition method. At this time, the first surface reformed layer 318a is a material selected from ceramic, oxide, nitride, and carbonate having excellent adhesive property with the adhesive sheet 320, and the sputter process is, for example, an oxide sputtering process.

The removing the guide film (S218) removes the guide film 312 adhered to the other surface of the Teflon film 311. In other words, the removing the guide film (S218) is a previous operation for forming the second surface reformed layer 318b on the other surface of the Teflon film 311, and removes the guide film 312 adhered to the other surface of the Teflon film 311 and the adhesive film 313.

The forming the second surface reformed layer (S219) forms the second surface reformed layer 318b on the other surface of the Teflon film 311. In other words, the forming the second surface reformed layer (S219) forms the second surface reformed layer 318b by depositing ceramic or oxide on the other surface of the Teflon film 311 (in other words, the lower surface on which the guide film 312 has been removed) through a sputter process, which is a vacuum deposition method. At this time, the second surface reformed layer 318b is a material selected from ceramic, oxide, nitride, and carbonate having excellent adhesive property with the adhesive sheet 320, and the sputter process is, for example, an oxide sputtering process.

The forming the first guide hole (S216) forms the plurality of first guide holes 317 penetrating the first surface reformed layer 318a, the Teflon film 311, and the second surface reformed layer 318b. In other words, the forming the first guide hole (S216) forms the plurality of first guide holes 317 in order to align the base sheets 310 at accurate locations while firmly fixing the base sheet 310 to the jig 200 in the stacking (S240) to be described later. Here, the forming the first guide hole (S216) forms the first guide hole 317 in the base sheet 310 through a punching process, a laser drill process, or the like.

Figure 14:
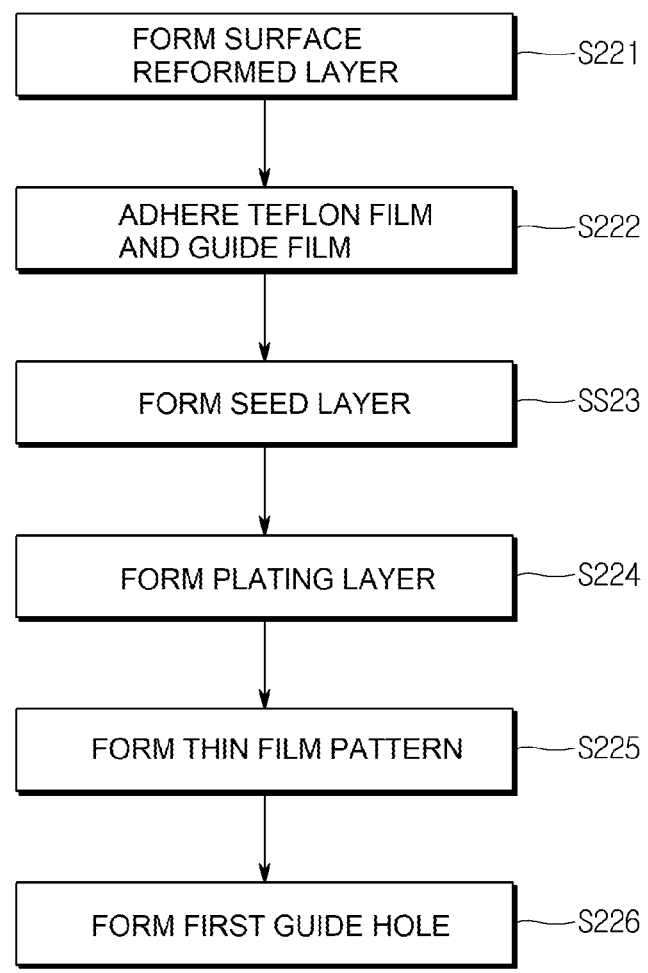
Figure 15:
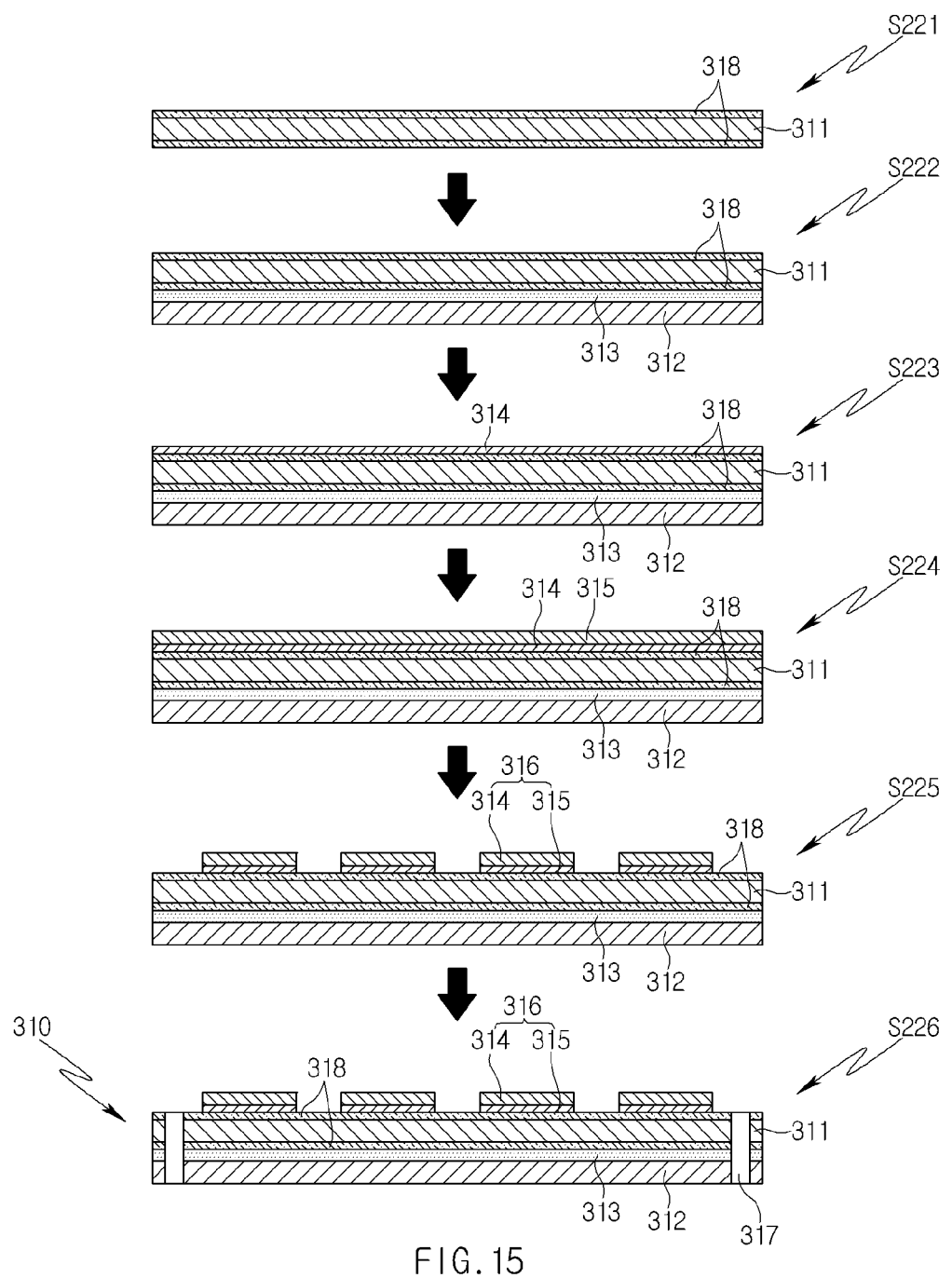

Referring to FIGS. 14 and 15, the preparing the base sheet (S210) forms the surface reformed layer 318 on at least one surface of both surfaces of the Teflon film 311. To this end, the preparing the base sheet (S210) includes forming a surface reformed layer (S221), adhering a Teflon film and a guide film (S222), forming a seed layer (S223), forming a plating layer (S224), forming a thin film pattern (S225), and forming a first guide hole (S226).

The forming the surface reformed layer (S221) forms the surface reformed layer 318 on the surface of the Teflon film 311. At this time, although it has been illustrated in FIG. 15 that the surface reformed layer 318 is formed on both surfaces (in other words, the upper surface and the lower surface) of the Teflon film 311, it is not limited thereto and the surface reformed layer 318 may be formed only on one surface of both surfaces of the Teflon film 311.

In other words, the forming the surface reformed layer (S221) may form the surface reformed layer 318 only on one surface, on which the thin film pattern 316 will be formed, of both surfaces of the Teflon film 311, or form the surface reformed layer 318 only on the other surface, to which the guide film will be adhered, of both surfaces of the Teflon film 311.

The forming the surface reformed layer (S221) forms the surface reformed layer 318 by depositing ceramic or oxide on the surface of the Teflon film 311 through a sputter process, which is a vacuum deposition method. At this time, the surface reformed layer 318 is a material selected from ceramic, oxide, nitride, and carbonate having excellent adhesive property with the adhesive sheet 320, and the sputter process is, for example, an oxide sputtering process.

As described above, the method for manufacturing the flexible printed circuit board may form the surface reformed layer 318, which is ceramic or oxide, on the surface of the Teflon film to improve the adhesive property of the surface of the Teflon film, thereby manufacturing the multi-layer flexible printed circuit board by using the Teflon film having a difficult-to-adhere property, and to adhere the Teflon film with the adhesive sheet of various materials, thereby minimizing the manufacturing cost of the flexible printed circuit board.

The adhering the Teflon film and the guide film (S222) adheres the guide film 312 to one surface of the Teflon film 311 in order to prevent deformation or breakage of the Teflon film 311 in the manufacturing process of the flexible printed circuit board. At this time, the guide film 312 is, for example, a hard polyethylene terephthalate (PET) film.

The adhering the Teflon film and the guide film (S222) adheres the Teflon film 311 and the guide film 312 by interposing the adhesive sheet 313 between the surface reformed layer 318 and the guide film 312 formed on one surface (in other words, the lower surface) of the Teflon film 311. In other words, since the guide film 312 should be removed in the stacking (S240) to be described later, the adhering the Teflon film and the guide film (S222) couples the Teflon film 311 and the guide film 312 in an adhering state (in other words, the adhesive sheet 313) capable of being easily removed while supporting the Teflon film 311. Here, the adhesive sheet 313 is, for example, a silicone (Si)-based adhesive agent.

Meanwhile, the adhering the Teflon film and the guide film (S222) may be omitted if the hard surface reformed layer is formed in the S221.

As described above, the method for manufacturing the flexible printed circuit board according to an embodiment of the present disclosure may form the base sheet 310 by adhering the guide film 312 to the Teflon film 311, thereby preventing the shape of the Teflon film 311 from being deformed or broken in the manufacturing process to prevent the manufacturing yield and reliability of the flexible printed circuit board from being degraded.

The forming the seed layer (S223) forms the seed layer 314 of a thin film on one surface of the Teflon film 311. The forming the seed layer (S223) forms the seed layer 314 on the upper surface of the surface reformed layer 318 formed on the other surface (in other words, the upper surface) of the Teflon film 311 through a deposition process or a sputtering process. Here, the forming the seed layer (S223) forms the seed layer 314 of a mixed material of mixing nickel copper (NiCu) and copper (Cu) or a nickel copper (NiCu) material on the other surface of the Teflon film 311.

The forming the plating layer (S224) forms the plating layer 315 on the seed layer 314. At this time, the forming the plating layer (S224) forms the plating layer 315 on the seed layer 314 by electroplating copper (Cu).

Here, the seed layer 314 and the plating layer 315 are elements constituting a circuit pattern, and are formed at a thickness of about 5 μm.

The forming the thin film pattern (S225) forms the thin film pattern 316 on the other surface of the Teflon film 311. In other words, the forming the thin film pattern (S225) forms the thin film pattern 316 of a predetermined shape by removing parts of the seed layer 314 and the plating layer 315 formed on the other surface of the Teflon film 311 through an etching process.

The forming the first guide hole 317 (S226) forms the plurality of first guide holes 317 penetrating the surface reformed layer 318, the Teflon film 311, and the guide film 312. In other words, the forming the first guide hole 317 (S226) forms the plurality of first guide holes 317 in order to align the base sheets 310 at accurate locations while firmly fixing the base sheet 310 to the jig 200 in the stacking (S240) to be described later. Here, the forming the first guide hole 317 (S226) forms the first guide hole 317 in the base sheet 310 through a punching process, a laser drill process, or the like.

The preparing the adhesive sheet (S230) prepares the adhesive sheet 320 in which the plurality of second guide holes 322 have been formed. At this time, the preparing the adhesive sheet (S230) forms the second guide hole 322 at a location corresponding to the first guide hole 317 at the time of stacking the base sheet 310 and the adhesive sheet 320.

The preparing the adhesive sheet (S230) may prepare the adhesive sheet 320 of a multi-layer structure on which an adhesive layer has been formed on one surface or both surfaces of a film base material.

For example, the adhesive sheet 320 may be a Casted polypropylene (CPP) film of low dielectric constant having a low dielectric loss. At this time, the CPP film is formed in a multi-layer structure in which an adhesive layer has been formed on one surface or both surfaces of a polypropylene (PP) film (hereinafter, PP film).

Here, the adhesive layer is made of a composite material of mixing the same material as the CPP film (for example, a material of polyethylene (PE), polypropylene (PP), polyimide, or the like) and an additive (for example, acrylate, or the like) in order to increase the adhesive force with polymer (in other words, the Teflon film 311 of the base sheet 310) and metal (in other words, the thin film pattern 316).

The preparing the adhesive sheet (S230) may also prepare the adhesive sheet 320 of a single layer structure. At this time, the preparing the adhesive sheet (S230) is, for example, to prepare the adhesive sheet 320 made of a composite material of mixing a material such as polyethylene, polypropylene, or polyimide and an additive, which has excellent adhesive property with polymer and metal.

The stacking (S240) stacks the plurality of base sheets 310 and the adhesive sheet 320. At this time, the stacking (S240) interposes the adhesive sheet 320 between the base sheets 310 by alternately stacking the base sheet 310 and the adhesive sheet 320.

The stacking (S240) stacks the plurality of base sheets 310 and the adhesive sheet 320 by using the jig 200. In other words, the stacking (S240) may provide reliability of the flexible printed circuit board only when the thin film patterns 316 of the base sheet 310 are stacked to be aligned at accurate locations.

Accordingly, the stacking (S240) stacks the plurality of base sheets 310 and the adhesive sheet 320 by using the jig 200 including the guide pin 220.

Figure 16:
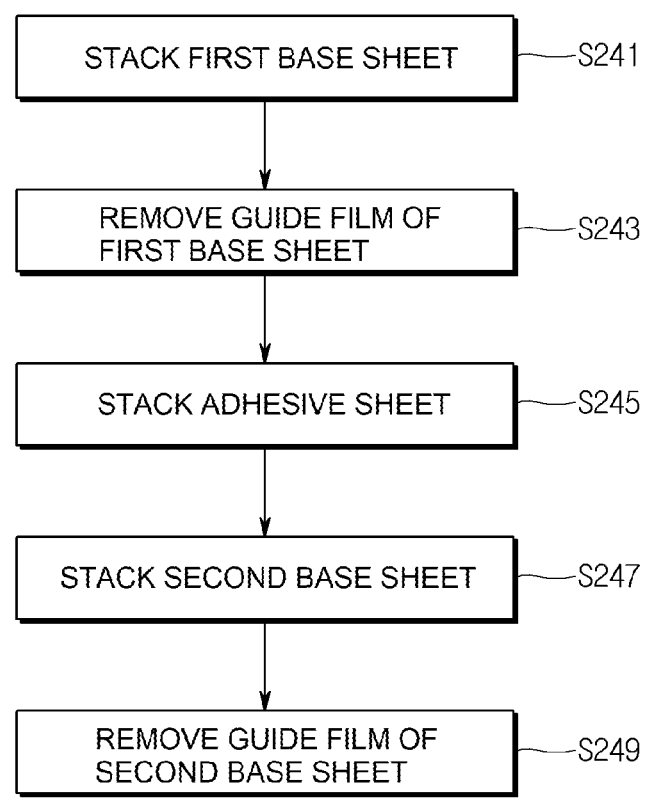
FIGS. 16 and 17 are diagrams for explaining the stacking of FIG. 8.
Figure 17:
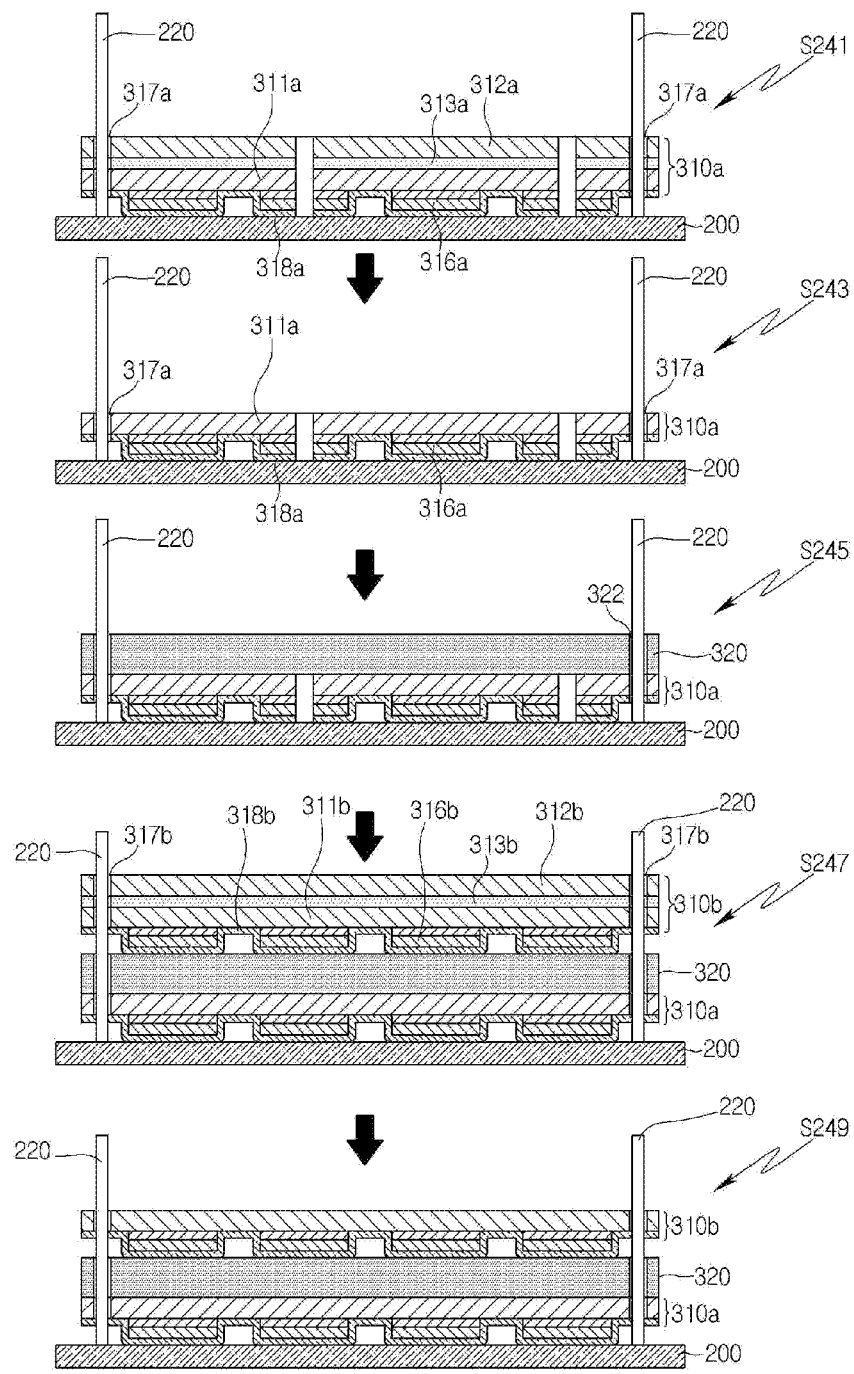

An example of the stacking (S240) that stacks two base sheets 310 (in other words, the first base sheet 310a and the second base sheet 310b) and the adhesive sheet 320 will be explained with reference to FIGS. 16 and 17 as follows.

The stacking (S240) includes stacking the first base sheet 310a (S241), removing the guide film 312a of the first base sheet 310a (S243), stacking the adhesive sheet 320 (S245), stacking the second base sheet 310b (S247), and removing the guide film 312b of the second base sheet 310b (S249).

The stacking the first base sheet 310a (S241) stacks the first base sheet 310a on the jig 200. In other words, the stacking the first base sheet 310a (S241) stacks the first base sheet 310a on the jig 200 by disposing so that the guide pins 220 of the jig 200 penetrate the first guide holes 317a of the first base sheet 310a, respectively and then moving them downwards.

At this time, the stacking the first base sheet 310a (S241) stacks the first base sheet 310a so that the thin film pattern 316a formed on the first base sheet 310a is positioned downwards in order to easily remove the guide film 312a. In other words, the stacking the first base sheet 310a (S241) disposes the guide film 312a on the top by stacking the first base sheet 310a so that the thin film pattern 316a is positioned downwards.

The removing the guide film 312a of the first base sheet 310a (S243) removes the guide film 312a from the first base sheet 310a stacked on the jig 200. In other words, the removing the guide film 312a of the first base sheet 310a (S243) removes the guide film 312a of the first base sheet 310a disposed on the top and an adhesive film 313a.

The stacking the adhesive sheet 320 (S245) stacks the adhesive sheet 320 on the jig 200. In other words, the stacking the adhesive sheet 320 (S245) stacks the adhesive sheet 320 on the jig 200 by disposing so that the guide pins 220 of the jig 200 penetrate the second guide holes 322 of the adhesive sheet 320, respectively and then moving them downwards. At this time, the stacking the adhesive sheet 320 (S245) stacks the adhesive sheet 320 above the first base sheet 310a stacked on the jig 200.

The stacking the second base sheet 310b (S247) stacks the second base sheet 310b on the jig 200. In other words, the stacking the second base sheet 310b (S247) stacks the second base sheet 310b on the jig 200 by disposing so that the guide pins 220 of the jig 200 penetrate the first guide holes 317b of the second base sheet 310b, respectively and then moving them downwards.

At this time, the stacking the second base sheet 310b (S247) stacks the second base sheet 310b above the adhesive sheet 320 stacked on the jig 200. The stacking the second base sheet 310b (S247) stacks the second base sheet 310b so that one surface, on which the thin film pattern 316b has been formed, is disposed above the adhesive sheet 320.

The removing the guide film 312b of the second base sheet 310b (S249) removes the guide film 312b from the second base sheet 310b stacked on the jig 200. In other words, the removing the guide film 312b of the second base sheet 310b (S249) removes the guide film 312b of the second base sheet 310b disposed on the top and an adhesive film 313b.

Here, in the case of a state where the surface reformed layer 318 has been formed on the lower surface of the base sheet 310 and the guide film has been removed, the operations S243 and S249 may be omitted.

As described above, the method for manufacturing the flexible printed circuit board may stack the plurality of base sheets 310 and the adhesive sheet 320 by disposing so that the guide pin 220 formed on the jig 200 penetrates the guide hole (in other words, the first guide hole 317 and the second guide hole 322) formed in the base sheet 310 and the adhesive sheet 320 and then moving them downwards in the stacking (S240) not to perform the alignment process of the stacked base materials (in other words, the base sheet 310 and the adhesive sheet 320) in the stacking process, thereby simplifying the manufacturing process.

Further, the method for manufacturing the flexible printed circuit board may stack the plurality of base sheets 310 and the adhesive sheet 320 by disposing so that the guide pin 220 formed on the jig 200 penetrates the guide hole (in other words, the first guide hole 317 and the second guide hole 322) formed in the base sheet 310 and the adhesive sheet 320 and then moving them downwards in the stacking (S240) to align the thin film patterns 316 formed on the stacked base sheets 310 at accurate locations, thereby preventing the manufacturing yield and reliability of the flexible printed circuit board from being degraded.

The adhering (S250) constitutes a stacked body by adhering the plurality of base sheets 310 and the adhesive sheets 320 stacked on the jig 200.

The adhering (S250) is, for example, to constitute the stacked body by compressing and preliminarily adhering the plurality of base sheets 310 and the adhesive sheets 320 and then mainly adhering the plurality of base sheets 310 and the adhesive sheets 320.

Here, the preliminary adhering is, for example, to compress the plurality of base sheets 310 and the adhesive sheet 320 stacked on the jig 200 through a Water Injection Molding (WIM) process that compresses it by applying a high water pressure.

The main adhering is, for example, to adhere the plurality of base sheets 310 and the adhesive sheet 320 preliminarily adhered through a hot press process applying a predetermined pressure and heat. At this time, the main adhering (in other words, the hot press process) adheres the plurality of base sheets 310 and the adhesive sheet 320 by applying a lower pressure than that in the preliminary adhering (in other words, the water injection molding process).

The adhering (S250) constitutes the stacked body by completing the adhering of the plurality of base sheets 310 and the adhesive sheet 320, and separates the stacked body from the jig 200.

The forming the via hole (S260) forms one or more via holes 330 penetrating the stacked body. In other words, the forming the via hole (S260) forms the via hole 330 in the stacked body separated from the jig 200 through a punching process, a laser drill process, or the like.

Here, although it has been illustrated in FIGS. 8 and 9 that the plurality of base sheets 310 and the adhesive sheet 320 are stacked and adhered to each other and then the via hole 330 is formed, it is not limited thereto and the respective base sheets 310 and the adhesive sheet 320 may also be stacked and adhered to each other after the via hole 330 is formed.

The forming the connection pattern (S270) forms a connection pattern 340 in the via hole 330 in order to electrically connect (in other words, electrically conduct) the thin film patterns 316 formed on the plurality of base sheets 310, respectively. At this time, the forming the connection pattern (S270) forms the connection pattern 340 by filling a conductive material in the via hole 330. Here, the forming the connection pattern (S270) may also form the connection pattern 340 by electroplating the conductive material on the inner wall surface of the via hole 330 and the thin film pattern 316 exposed to the outside of the stacked body.

Meanwhile, the method for manufacturing the flexible printed circuit board may further include forming a protective layer on the upper surface of the stacked body configured by stacking the plurality of base sheets 310 and the adhesive sheet 320.

The forming the protective layer forms a protective layer covering the surfaces of the thin film pattern 316 and the base sheet 310 by applying and then curing a coating liquid on the surfaces of the base material and the thin film pattern 316 stacked on the uppermost portion of the stacked body. At this time, the protective layer may be made of a composite material containing a resin such as polypropylene and polyimide.

Further, the method for manufacturing the flexible printed circuit board may further include forming an electrode part. At this time, the forming the electrode part may form the electrode part by removing a part of the protective layer and then electroplating a conductive material such as copper on the corresponding area. Here, the electrode part may be formed on at least one of the plurality of thin film patterns 316 disposed on the upper surface of the stacked body.

Figure 18:
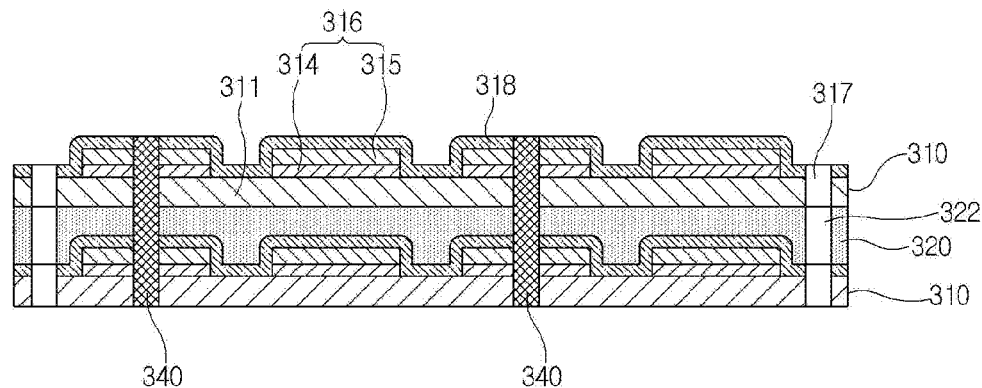
FIGS. 18 to 23 are diagrams for explaining a flexible printed circuit board according to the second embodiment of the present disclosure.
Figure 19:
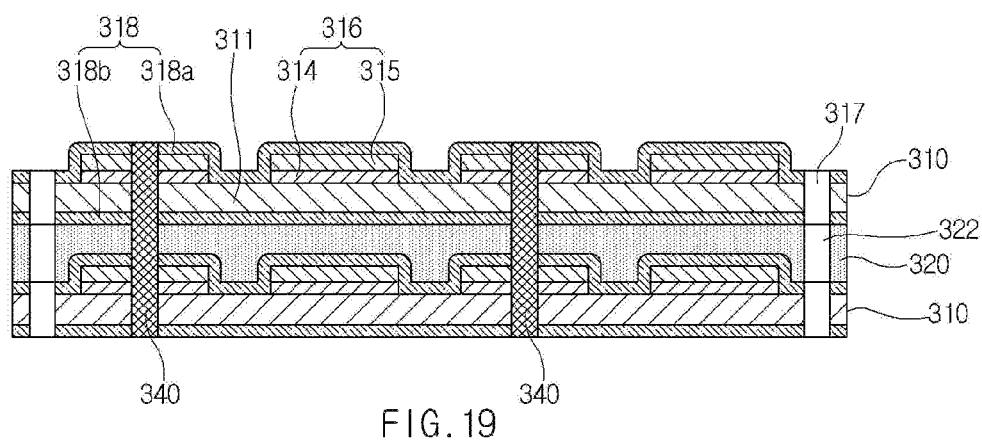

Referring to FIGS. 18 and 19, a flexible printed circuit board according to the second embodiment of the present disclosure may be configured to include the stacked body in which the plurality of base sheets 310 and the adhesive sheet 320 have been alternately stacked and then adhered to each other, and a circuit pattern formed in the stacked body and on the upper surface thereof. Here, although it has been illustrated in FIGS. 18 and 19 that the flexible printed circuit board has two base sheets 310 and one adhesive sheet 320 stacked thereon for convenience of description, the flexible printed circuit board may have three or more base sheets 310 and two or more adhesive sheets 320 stacked thereon, which may be configured variously according to the required thickness.

The stacked body is configured by alternately stacking the plurality of base sheets 310 and the adhesive sheet 320. In other words, the stacked body is configured by repeatedly stacking the plurality of base sheets 310, and the adhesive sheet 320 is interposed between the base sheets 310 to adhere the base sheets 310.

At this time, the base sheet 310 has the surface reformed layer 318 disposed on at least one surface of both surfaces (in other words, the upper surface and the lower surface) thereof in order to resolve a difficult-to-adhere property of the Teflon film 311.

In other words, as illustrated in FIG. 18, the surface reformed layer 318 is formed on one surface (in other words, the upper surface), on which the thin film pattern 316 has been formed, of both surfaces of the base sheet 310. At this time, the surface reformed layer 318 is formed on the upper surface and the periphery of the thin film pattern 316, and the upper surface of the Teflon film 311 exposed to the space between the thin film patterns 316.

Meanwhile, as illustrated in FIG. 19, the surface reformed layer 318 may also be formed on both surfaces (in other words, the upper surface and the lower surface) of the base sheet 310. In other words, the surface reformed layer may also be formed on the upper surface and the periphery of the thin film pattern 316, a part of the upper surface of the Teflon film 311 exposed to the space between the thin film patterns 316, and the entire lower surface of the Teflon film 311.

On the other hand, the stacked body may also be configured by interchangeably using the Teflon film 311 having the surface reformed layer 318 formed only on the upper surface thereof, the Teflon film 311 having the surface reformed layer 318 formed only on the lower surface thereof, and the Teflon film 311 having the surface reformed layer 318 formed on both surfaces thereof.

Figure 20:
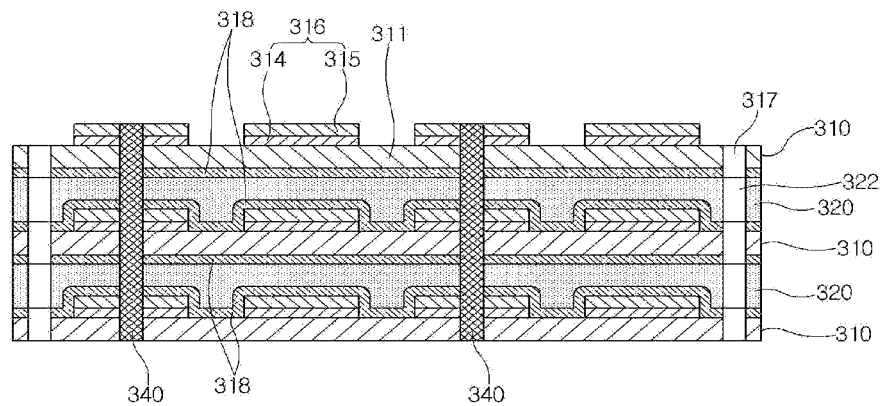

For example, as illustrated in FIG. 20, the base sheet 310, which has been stacked on the uppermost portion, of the base sheets 310 constituting the stacked body may have the surface reformed layer 318 formed only on the lower surface thereof, and the base sheet 310 stacked on the lowermost portion thereof may have the surface reformed layer 318 formed only on the upper surface thereof. At this time, other base sheets 310 interposed between the base sheets 310 stacked on the uppermost portion and the lowermost portion thereof have the surface reformed layer 318 formed on both surfaces (in other words, the upper surface and the lower surface) thereof.

The circuit pattern is composed of the thin film pattern 316 exposed to the upper surface of the stacked body, the thin film pattern 316 interposed in the stacked body, and the connection pattern 340 electrically connecting them.

In other words, as the base sheets 310 are stacked, the circuit pattern has the thin film pattern 316, which has been formed on the base sheet 310 stacked on the uppermost portion thereof, exposed to the upper surface of the stacked body, and has the thin film patterns 316 formed on other base sheets 310 interposed in the stacked body. At this time, the thin film patterns 316 are electrically connected (in other words, electrically conducted) through the connection pattern 340 formed in the via hole 330.

Figure 21:
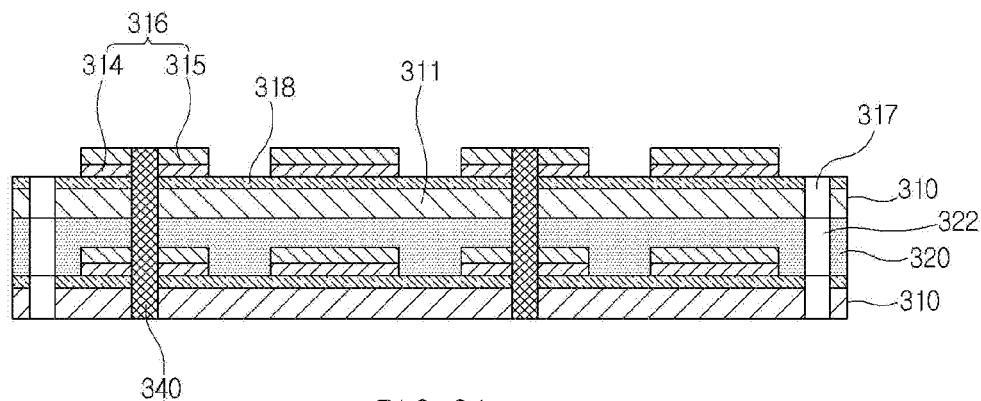
Figure 22:
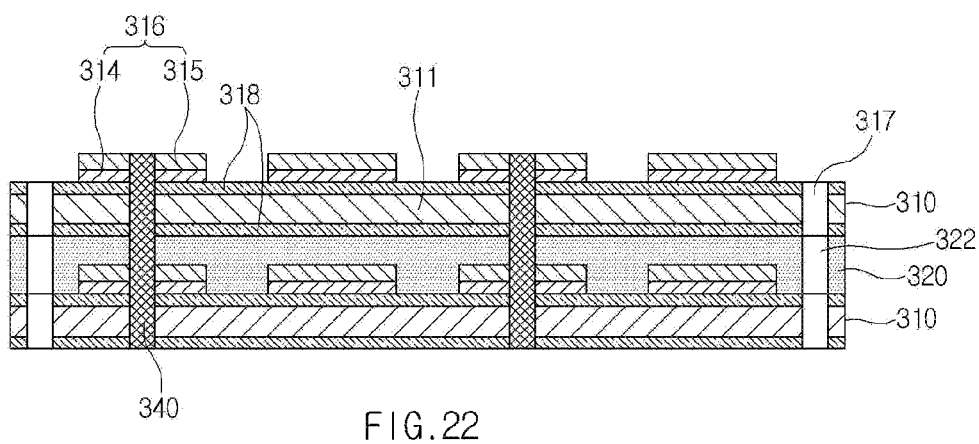

Referring to FIGS. 21 and 22, the flexible printed circuit board according to the second embodiment of the present disclosure is configured to include the stacked body in which the plurality of base sheets 310 and the adhesive sheet 320 have been alternately stacked and then adhered to each other, and the circuit pattern formed in the stacked body and on the upper surface thereof. Here, although it has been illustrated in FIGS. 21 and 22 that the flexible printed circuit board has two base sheets 310 and one adhesive sheet 320 stacked thereon for convenience of description, the flexible printed circuit board may have three or more base sheets 310 and two or more adhesive sheets 320 stacked thereon, which may be configured variously according to the required thickness.

The stacked body is configured by alternately stacking the plurality of base sheets 310 and the adhesive sheet 320. In other words, the stacked body is configured by repeatedly stacking the plurality of base sheets 310, and the adhesive sheet 320 is interposed between the base sheets 310 to adhere the base sheets 310.

At this time, the base sheet 310 has the surface reformed layer 318 disposed on at least one surface of both surfaces (in other words, the upper surface and the lower surface) thereof in order to resolve a difficult-to-adhere property of the Teflon film 311.

In other words, as illustrated in FIG. 21, the surface reformed layer 318 is formed on one surface (in other words, the upper surface), on which the thin film pattern 316 has been formed, of both surfaces of the base sheet 310. At this time, the surface reformed layer 318 is formed at a predetermined thickness on the upper surface of the Teflon film 311, and the thin film patterns 316 are formed on the upper surface of the surface reformed layer 318.

Meanwhile, as illustrated in FIG. 22, the surface reformed layer 318 may also be formed on both surfaces (in other words, the upper surface and the lower surface) of the base sheet 310.

On the other hand, the stacked body may also be configured by interchangeably using the Teflon film 311 having the surface reformed layer 318 formed only on the upper surface thereof, the Teflon film 311 having the surface reformed layer 318 formed only on the lower surface thereof, and the Teflon film 311 having the surface reformed layer 318 formed on both surfaces thereof.

Figure 23:
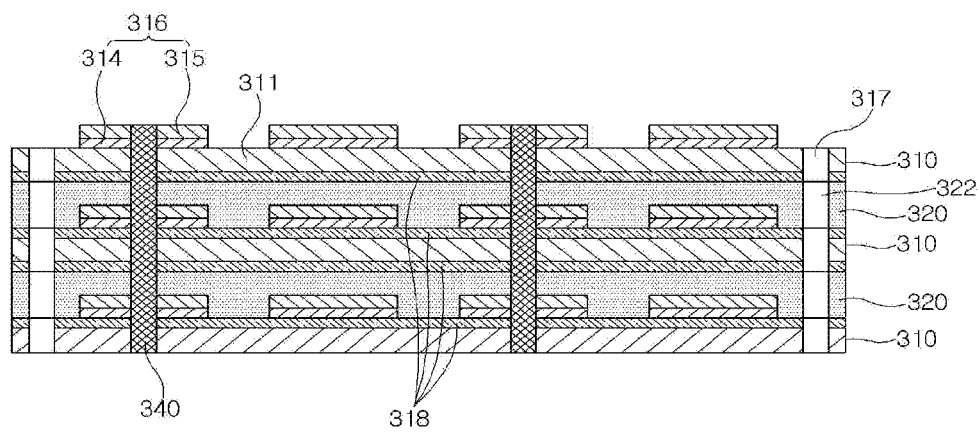

For example, as illustrated in FIG. 23, the base sheet 310, which has been stacked on the uppermost portion, of the base sheets 310 constituting the stacked body may have the surface reformed layer 318 formed only on the lower surface thereof, and the base sheet 310 stacked on the lowermost portion thereof may have the surface reformed layer 318 formed only on the upper surface thereof. At this time, other base sheets 310 interposed between the base sheets 310 stacked on the uppermost portion and the lowermost portion thereof have the surface reformed layer 318 formed on both surfaces (in other words, the upper surface and the lower surface) thereof.

The circuit pattern is composed of the thin film pattern 316 exposed to the upper surface of the stacked body, the thin film pattern 316 interposed in the stacked body, and the connection pattern 340 electrically connecting them.

In other words, as the base sheets 310 are stacked, the circuit pattern has the thin film pattern 316, which has been formed on the base sheet 310 stacked on the uppermost portion thereof, exposed to the upper surface of the stacked body, and has the thin film patterns 316 formed on other base sheets 310 interposed in the stacked body. At this time, the thin film patterns 316 are electrically connected (in other words, electrically conducted) through the connection pattern 340 formed in the via hole 330.

Here, although it has been illustrated in FIGS. 18 to 23 that the adhesive sheet 320 is configured in a single layer, it is not limited thereto and may also be configured in a multi-layer structure.

Further, although it has been illustrated in FIGS. 18 to 23 that the connection pattern 340 is formed by being filled in the via hole 330, it is not limited thereto and may also be formed by being plated on the inner wall surface of the via hole 330.

Figure 24:
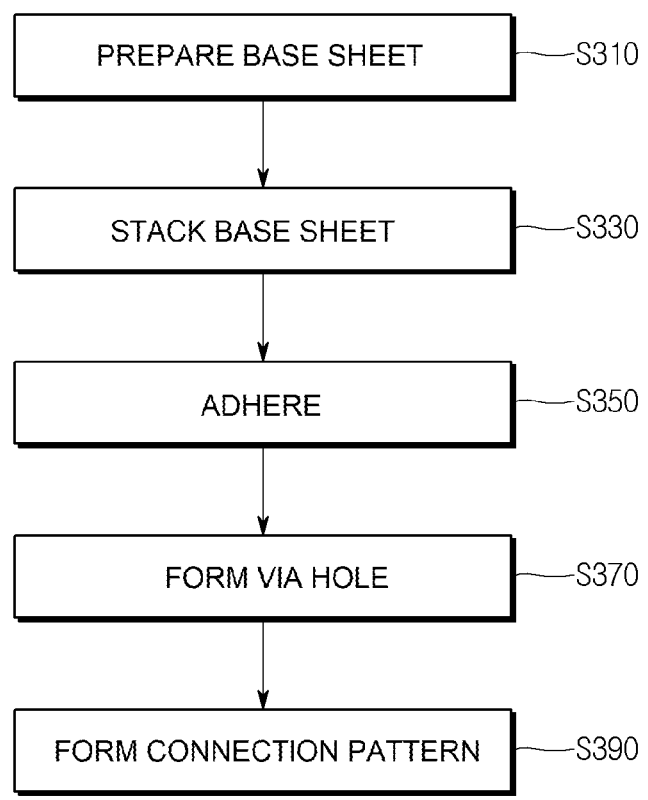
FIGS. 24 and 25 are diagrams for explaining a method for manufacturing a flexible printed circuit board according to a third embodiment of the present disclosure.
Figure 25:
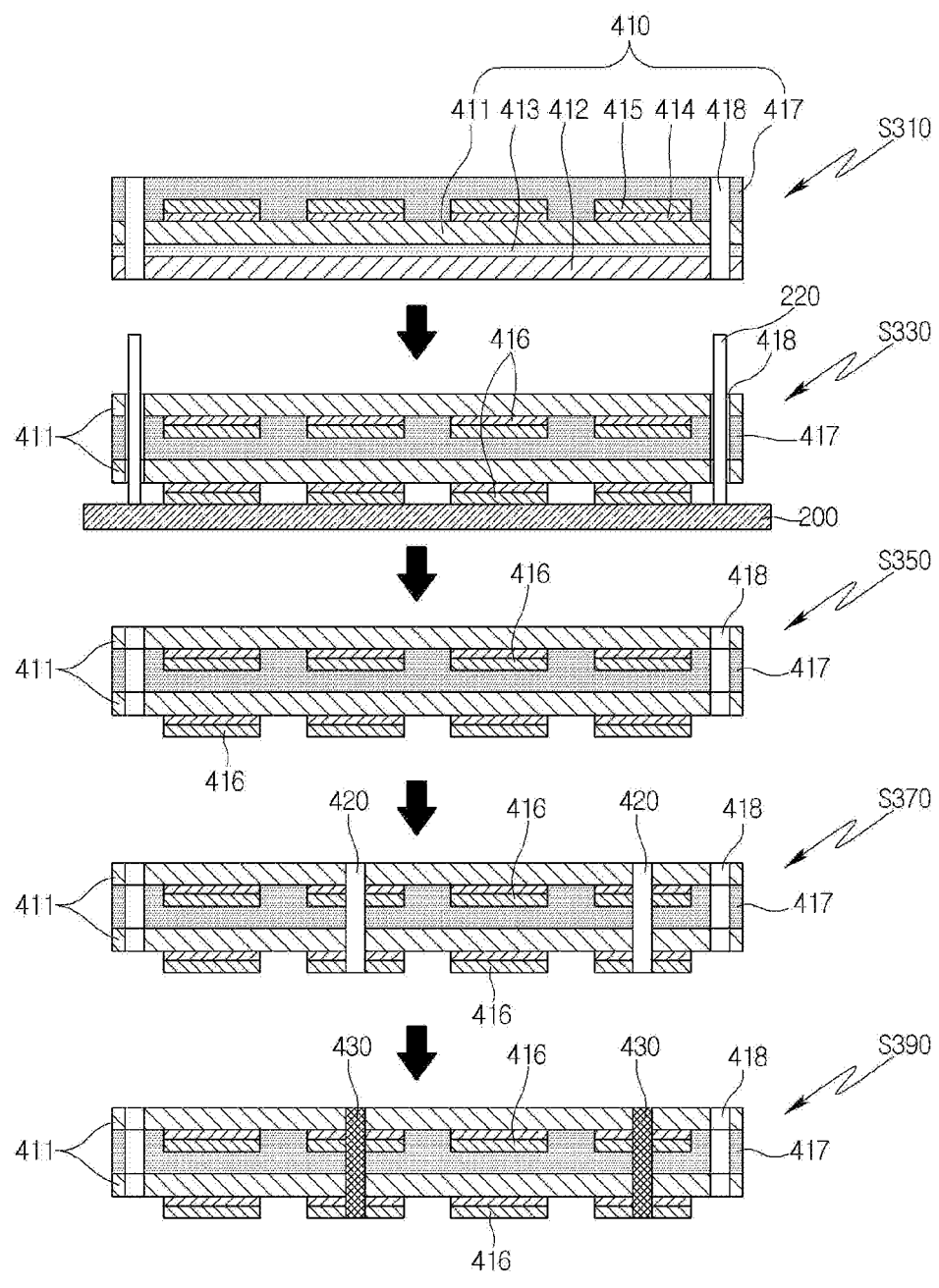

Referring to FIGS. 24 and 25, a method for manufacturing a flexible printed circuit board according to a third embodiment of the present disclosure includes preparing a base sheet (S310), stacking (S330), adhering (S350), forming a via hole (S370), and forming a connection pattern (S390).

The preparing the base sheet (S310) prepares a base sheet 410 on which a guide film 412, a Teflon film 411, and a thin film pattern 416 are sequentially stacked, and in which a guide hole 418 penetrating the guide film 412 and the Teflon film 411 is formed. At this time, the guide hole 418 is a hole into which the guide pin 220 of the jig 200 is inserted in order to easily perform the stacking (S330) to be described later.

The preparing the base sheet (S310) forms an adhesive layer 417 on the Teflon film 411 in order to improve the adhesive property of the Teflon film 411. The preparing the base sheet (S310) forms the adhesive layer 417 only on one surface, which is adhered to another base sheet 410, of the upper surface and the lower surface of the Teflon film 411. At this time, the preparing the base sheet (S310) forms the adhesive layer 417 on the upper surface and the lower surface of the Teflon film 411. Here, the adhesive layer 417 is a Teflon material, for example.

Figure 26:
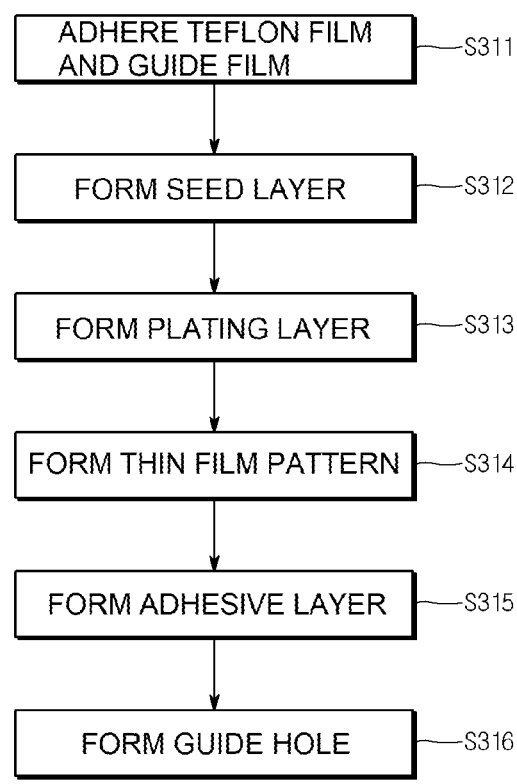
FIGS. 26 to 31 are diagrams for explaining the preparing the base sheet of FIG. 24.
Figure 27:
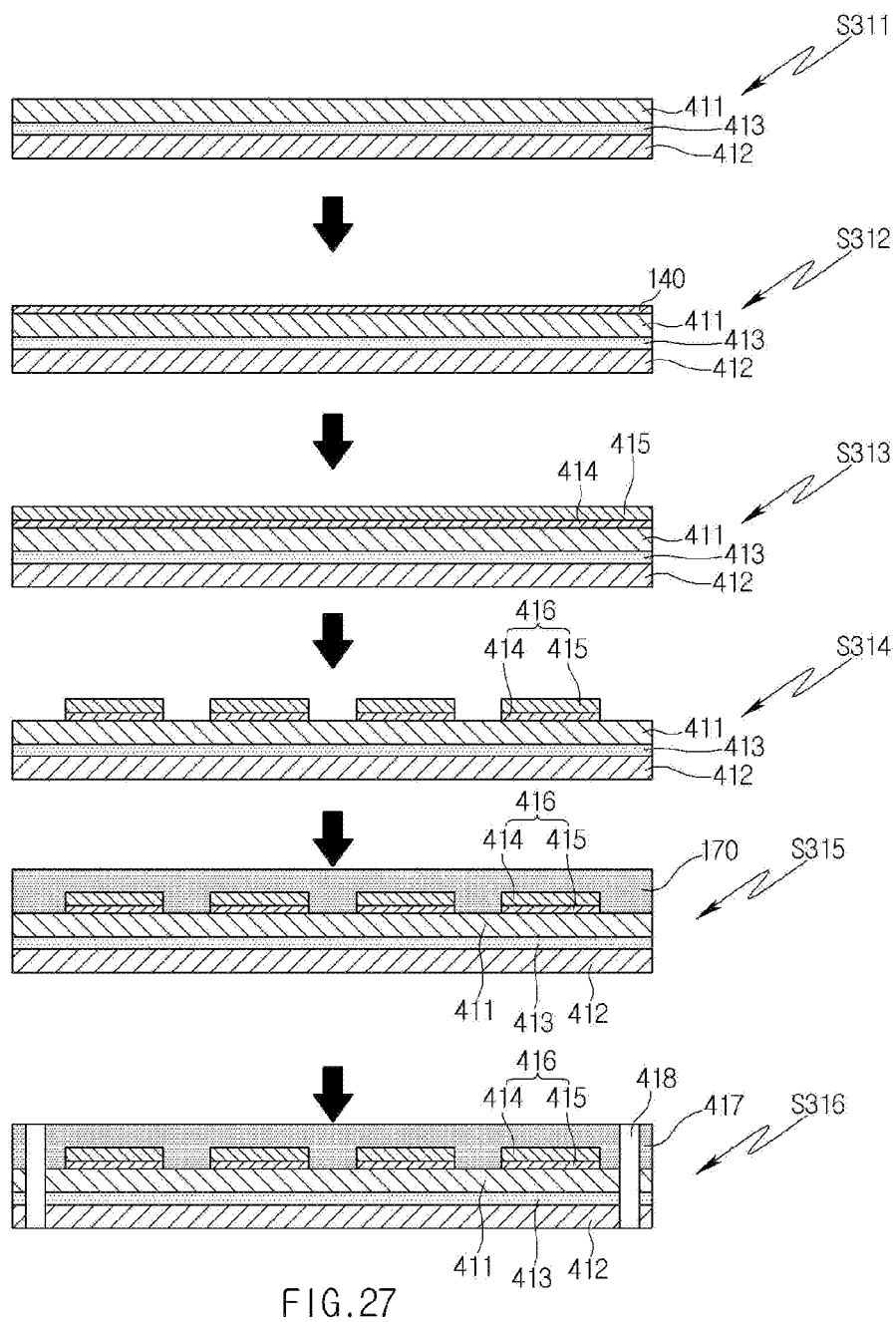

Referring to FIGS. 26 and 27, the preparing the base sheet (S310) includes adhering a Teflon film and a guide film (S311), forming a seed layer (S312), forming a plating layer (S313), forming a thin film pattern (S314), forming an adhesive layer (S315), and forming a guide hole (S316).

The adhering the Teflon film and the guide film (S311) prepares the Teflon film 411 of heat resistance and low dielectric constant.

In general, the flexible printed circuit board has been completely manufactured, and then is mounted with a semiconductor element through a surface mount technology process (in other words, an SMT process).

At this time, since the conventional flexible printed circuit board constitutes the base sheet 410 by using polypropylene (PP) having heat resistance of about 160° C. to 180° C., the base sheet 410 is deformed or broken by the heat (about 250° C.) applied in the reflow process of the surface mount technology process, thereby degrading reliability of the flexible printed circuit board.

The method for manufacturing the flexible printed circuit board according to an embodiment of the present disclosure constitutes the base sheet 410 by using the Teflon film 411 in order to prevent reliability of the flexible printed circuit board from being degraded.

In other words, since the Teflon film 411 is not deformed even in the heat of about 300° C., deformation and breakage of the base sheet due to the heat applied in the reflow process may be prevented.

Accordingly, the adhering the Teflon film and the guide film (S311) constitutes the base sheet 410 by using the Teflon film 411.

As a result, the method for manufacturing the flexible printed circuit board and the flexible printed circuit board manufactured by the same may prevent deformation and breakage of the flexible printed circuit board due to the heat applied in the reflow process, thereby improving reliability.

The Teflon is mainly used as lubricant, release material, and insulation material. Since the Teflon has the best heat resistance and dielectric properties (in other words, low dielectric constant) among polymer materials, it is used as a base material of a printed circuit board for a high frequency requiring low dielectric constant and heat resistance.

However, since the Teflon is soft-melting and thermoplastic, the base material is deformed by heat and pressure applied in the manufacturing process, thereby causing a high defective rate. Accordingly, the Teflon is mainly used as a thick hard-type single-sided or double-sided base material.

In an embodiment of the present disclosure, the Teflon film 411 of a thin film is used as the base sheet 410 in order to manufacture a flexible printed circuit board. The Teflon film 411 is deformed or broken in a shape even at a small pressure applied in the manufacturing process due to the soft-melting property, thereby degrading the manufacturing yield and reliability of the flexible printed circuit board.

Accordingly, the adhering the Teflon film and the guide film (S311) adheres the guide film 412 to one surface of the Teflon film 411 in order to prevent deformation and breakage of the Teflon film 411 in the manufacturing process. At this time, the guide film 412 is, for example, a hard polyethylene terephthalate (PET) film.

The adhering the Teflon film and the guide film (S311) adheres the Teflon film 411 and the guide film 412 by interposing an adhesive sheet 413 between the Teflon film 411 and the guide film 412. In other words, since the guide film 412 should be removed in the stacking (S330) to be described later, the adhering the Teflon film and the guide film (S311) couples the Teflon film 411 and the guide film 412 in an adhering state (in other words, the adhesive sheet 413) capable of being easily removed while supporting the Teflon film 411. Here, the adhesive sheet 413 is, for example, a silicone (Si)-based adhesive agent.

As described above, the method for manufacturing the flexible printed circuit board according to an embodiment of the present disclosure may form the base sheet 410 by adhering the guide film 412 to the Teflon film 411, thereby preventing the shape of the Teflon film 411 from being deformed or broken in the manufacturing process to prevent the manufacturing yield and reliability of the flexible printed circuit board from being degraded.

The forming the seed layer (S312) forms a seed layer 414 of a thin film on one surface of the Teflon film 411. The forming the seed layer (S312) forms the seed layer 414 on the other surface (in other words, the surface opposite to one surface to which the guide film 412 has been adhered) of the Teflon film 411 through a deposition process or a sputtering process.

Here, the forming the seed layer (S312) forms the seed layer 414 of a mixed material of mixing nickel copper (NiCu) and copper (Cu) or a nickel copper (NiCu) material on the other surface of the Teflon film 411.

The forming the plating layer (S313) forms a plating layer 415 on the seed layer 414. At this time, the forming the plating layer (S313) forms the plating layer 415 on the seed layer 414 by electroplating copper (Cu).

Here, the seed layer 414 and the plating layer 415 are elements constituting the circuit pattern, and are formed at a thickness of about 5 μm.

The forming the thin film pattern (S314) forms a thin film pattern 416 on the other surface of the Teflon film 411. In other words, the forming the thin film pattern (S314) forms the thin film pattern 416 of a predetermined shape by removing parts of the seed layer 414 and the plating layer 415 formed on the other surface of the Teflon film 411 through an etching process.

The forming the adhesive layer (S315) forms an adhesive layer 417 on one surface of the Teflon film 411. In other words, the forming the adhesive layer (S315) forms the adhesive layer 417 on one surface, on which the thin film pattern 416 has been formed, of both surfaces (in other words, the upper surface and lower surface) of the Teflon film 411. At this time, the adhesive layer 417 is formed on the upper surface and the periphery of the thin film pattern 416, and the upper surface of the Teflon film 411 exposed to the space between the thin film patterns 416.

Here, although it has been illustrated in FIG. 27 that the surface of the adhesive layer 417 is flat, the adhesive layer 417 may be actually formed so that a portion formed above the thin film pattern 416 is higher than the other portions, thereby forming unevenness.

The forming the adhesive layer (S315) forms the adhesive layer 417 on one surface of the Teflon film 411 through an impregnation coating process. In other words, the forming the adhesive layer (S315) inserts the Teflon film 411 into a solvent (for example, water) in a state where a Teflon slurry (grains) has been dispersed and then presses it at high heat. Accordingly, the Teflon slurry is impregnation-coated on the surface of the Teflon film 411 to form the adhesive layer 417.

The forming the adhesive layer (S315) may also form the adhesive layer 417 on one surface of the Teflon film 411 through a printing process. In other words, the forming the adhesive layer (S315) forms the adhesive layer 417 by printing (for example, gravuring, spraying) the Teflon slurry on one surface of the Teflon film 411.

The forming the guide hole (S316) forms the plurality of guide holes 418 penetrating the adhesive layer 417, the Teflon film 411, and the guide film 412. In other words, the forming the guide hole (S316) forms the plurality of guide holes 418 in order to align the base sheets 410 at accurate locations while firmly fixing the base sheet 410 to the jig 200 in the stacking (S330) to be described later. Here, the forming the guide hole (S316) forms the guide hole 418 in the base sheet 410 through a punching process, a laser drill process, or the like.

Meanwhile, the preparing the base sheet (S310) may also form the adhesive layer 417 (in other words, a first adhesive layer 417a and a second adhesive layer 417b) on both surfaces of the Teflon film 411.

Figure 28:
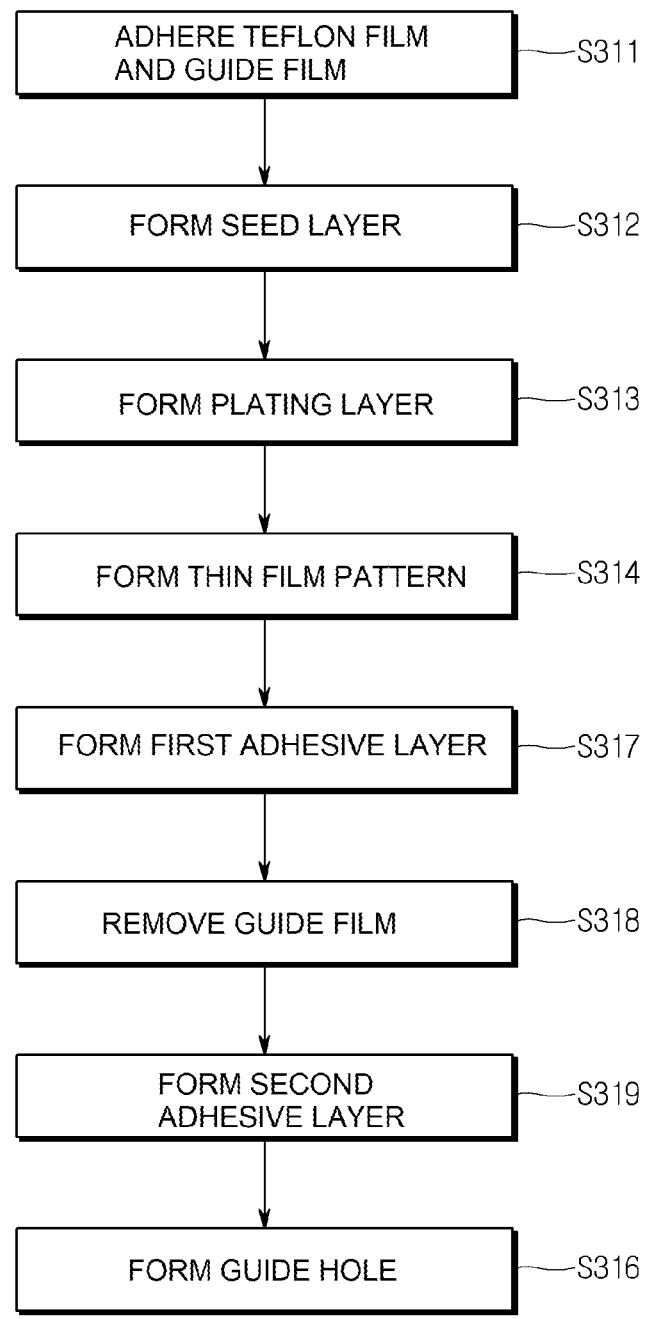
Figure 29:
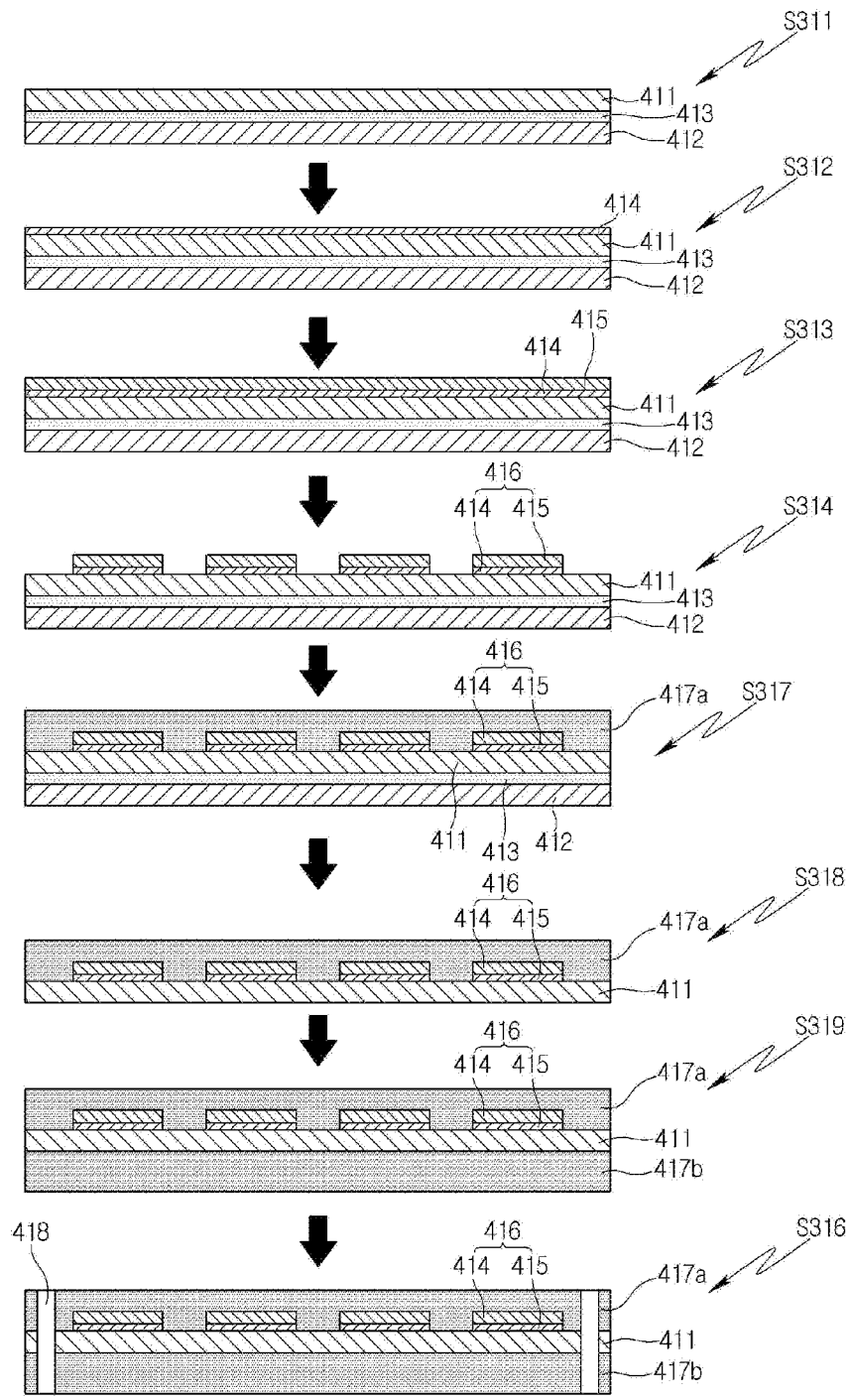

To this end, referring to FIGS. 28 and 29, the forming the adhesive layer (S315) may include forming a first adhesive layer (S317), removing a guide film (S318), and forming a second adhesive layer (S319).

The adhering the Teflon film and the guide film (S311) adheres the guide film 412 to one surface of the Teflon film 411 of heat resistance and low dielectric constant. At this time, the guide film 412 is, for example, a hard polyethylene terephthalate (PET) film.

The adhering the Teflon film and the guide film (S311) adheres the Teflon film 411 and the guide film 412 by interposing the adhesive sheet 413 between the Teflon film 411 and the guide film 412.

At this time, in order to easily remove the guide film 412 in the stacking (S330) to be described later, the adhering the Teflon film and the guide film (S311) couples the Teflon film 411 and the guide film 412 in an adhering state (in other words, the adhesive sheet 413) capable of being easily removed while supporting the Teflon film 411. Here, the adhesive sheet 413 is, for example, a silicone (Si)-based adhesive agent.

The forming the first adhesive layer (S317) forms the first adhesive layer 417a on one surface of the Teflon film 411. In other words, the forming the first adhesive layer (S317) forms the first adhesive layer 417a on one surface, on which the thin film pattern 416 has been formed, of both surfaces (in other words, the upper surface and the lower surface) of the Teflon film 411.

The forming the first adhesive layer (S317) forms the first adhesive layer 417a of a Teflon material on one surface of the Teflon film 411 through an impregnation coating process or a printing process (for example, gravure printing, spray printing, or the like).

The removing the guide film (S318) removes the guide film 412 adhered to the other surface of the Teflon film 411. In other words, the removing the guide film (S318) is a previous operation for forming the second adhesive layer 417b on the other surface of the Teflon film 411, and removes the guide film 412 adhered to the other surface of the Teflon film 411 and the adhesive film 413.

The forming the second adhesive layer (S319) forms the second adhesive layer 417b on the other surface of the Teflon film 411. In other words, the forming the second adhesive layer (S319) forms the second adhesive layer 417b of a Teflon material on the other surface (in other words, the lower surface on which the guide film 412 has been removed) of the Teflon film 411 through an impregnation coating process or a printing process.

As described above, the method for manufacturing the flexible printed circuit board may form the adhesive layer 417 of a Teflon material on the surface of the Teflon film 411 to improve the adhesive property of the surface of the Teflon film 411, thereby manufacturing the multi-layer flexible printed circuit board by using the Teflon film 411 having a difficult-to-adhere property.

The forming the guide hole (S316) forms the plurality of guide holes 418 penetrating the first adhesive layer 417a, the Teflon film 411, and the second adhesive layer 417b. In other words, the forming the guide hole (S316) forms the plurality of guide holes 418 in order to align the base sheets 410 at accurate locations while firmly fixing the base sheet 410 to the jig 200 in the stacking (S330) to be described later. Here, the forming the guide hole (S316) forms the guide hole 418 in the base sheet 410 through a punching process, a laser drill process, or the like.

Figure 30:
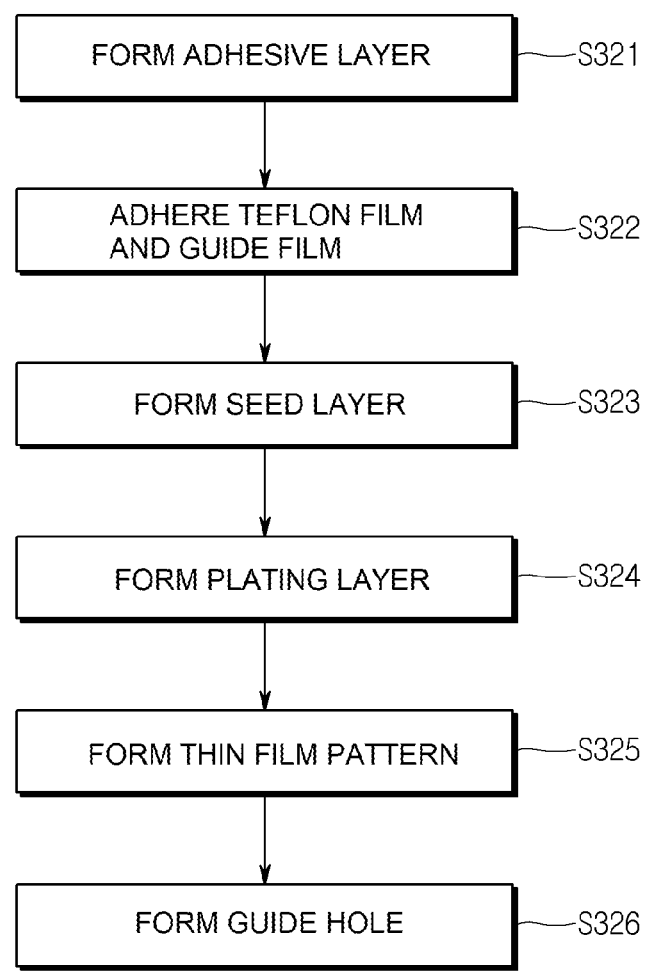
Figure 31:
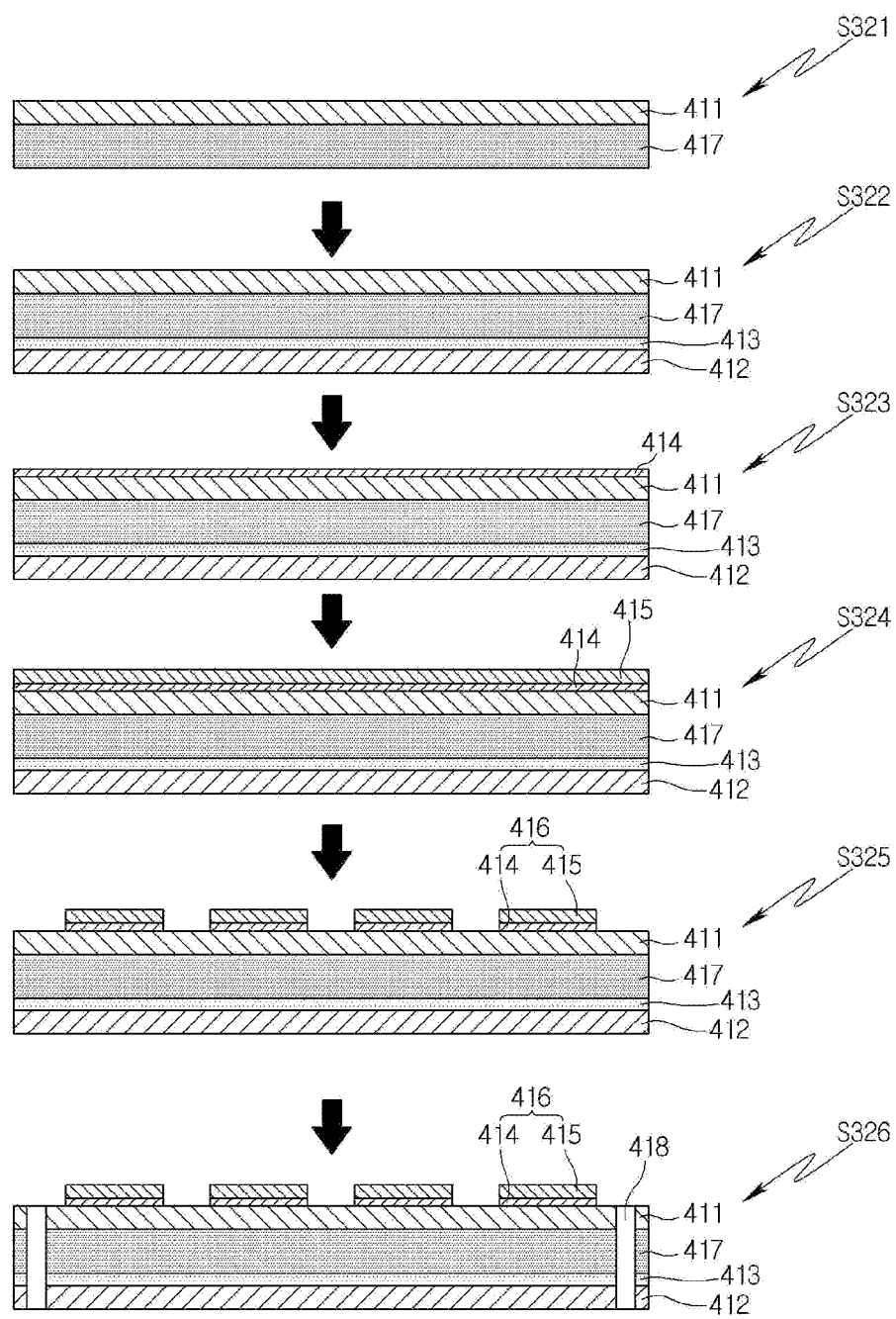

Referring to FIGS. 30 and 31, the preparing the base sheet (S310) forms the thin film pattern 416 after forming the adhesive layer 417 on at least one surface of both surfaces of the Teflon film 411.

To this end, the preparing the base sheet (S310) includes forming an adhesive layer (S321), adhering the Teflon film 411 and the guide film 412 (S322), forming a seed layer (S323), forming a plating layer (S324), forming a thin film pattern (S325), and forming a guide hole (S326).

The forming the adhesive layer (S321) forms the adhesive layer 417 on the surface of the Teflon film 411 through an impregnation coating process or a printing process. At this time, the forming the adhesive layer (S321) is, for example, to form the adhesive layer 417 of a Teflon material on the surface of the Teflon film 411.

The forming the adhesive layer (S321) may form the adhesive layer 417 only on one surface, on which the thin film pattern 416 will be formed, of the both surfaces of the Teflon film 411, or form the adhesive layer 417 only on the other surface, to which the guide film 412 will be adhered, of both surfaces of the Teflon film 411.

Here, although it has been illustrated in FIG. 31 that the adhesive layer 417 is formed only on one surface (in other words, the lower surface) of the Teflon film 411, it is not limited thereto and the adhesive layer 417 may also be formed on both surfaces (in other words, the upper surface and the lower surface) of the Teflon film 411.

As described above, the method for manufacturing the flexible printed circuit board may form the adhesive layer 417 of a Teflon material on the surface of the Teflon film 411 to improve the adhesive property of the surface of the Teflon film 411, thereby manufacturing the multi-layer flexible printed circuit board by using the Teflon film 411 having a difficult-to-adhere property.

The adhering the Teflon film 411 and the guide film 412 (S322) adheres the guide film 412 to one surface of the Teflon film 411 in order to prevent deformation or breakage of the Teflon film 411 in the manufacturing process of the flexible printed circuit board. At this time, the guide film 412 is, for example, a hard polyethylene terephthalate (PET) film.

The adhering the Teflon film 411 and the guide film 412 (S322) adheres the Teflon film 411 and the guide film 412 by interposing the adhesive sheet 413 between the adhesive layer 417 and the guide film 412 formed on one surface (in other words, the lower surface) of the Teflon film 411. In other words, since the guide film 412 should be removed in the stacking (S330) to be described later, the adhering the Teflon film 411 and the guide film 412 (S322) couples the Teflon film 411 and the guide film 412 in an adhering state (in other words, the adhesive sheet 413) capable of being easily removed while supporting the Teflon film 411. Here, the adhesive sheet 413 is, for example, a silicone (Si)-based adhesive agent.

As described above, the method for manufacturing the flexible printed circuit board according to an embodiment of the present disclosure may form the base sheet 410 by adhering the guide film 412 to the Teflon film 411, thereby preventing the shape of the Teflon film 411 from being deformed or broken in the manufacturing process to prevent the manufacturing yield and reliability of the flexible printed circuit board from being degraded.

The forming the seed layer (S323) forms the seed layer 414 of a thin film on one surface of the Teflon film 411. The forming the seed layer (S323) forms the seed layer 414 on the upper surface of the adhesive layer 417 formed on the other surface (in other words, the upper surface) of the Teflon film 411 through a deposition process or a sputtering process. Here, the forming the seed layer (S323) forms the seed layer 414 of a mixed material of mixing nickel copper (NiCu) and copper (Cu) or a nickel copper (NiCu) material on the other surface of the Teflon film 411.

The forming the plating layer (S324) forms the plating layer 415 on the seed layer 414. At this time, the forming the plating layer (S324) forms the plating layer 415 on the seed layer 414 by electroplating copper (Cu).

Here, the seed layer 414 and the plating layer 415 are elements constituting the circuit pattern, and are formed at a thickness of about 5 μm.

The forming the thin film pattern (S325) forms a thin film pattern 416 on the other surface of the Teflon film 411. In other words, the forming the thin film pattern (S325) forms the thin film pattern 416 of a predetermined shape by removing parts of the seed layer 414 and the plating layer 415 formed on the other surface of the Teflon film 411 through an etching process.

The forming the guide hole (S326) forms the plurality of guide holes 418 penetrating the adhesive layer 417, the Teflon film 411, and the guide film 412. In other words, the forming the guide hole (S326) forms the plurality of guide holes 418 in order to align the base sheets 410 at accurate locations while firmly fixing the base sheet 410 to the jig 200 in the stacking (S330) to be described later. Here, the forming the guide hole (S326) forms the guide hole 418 in the base sheet 410 through a punching process, a laser drill process, or the like.

The stacking (S330) stacks the plurality of base sheets 410. The stacking (S330) stacks the plurality of base sheets 410 by using the jig 200.

At this time, the stacking (S330) may provide reliability of the flexible printed circuit board only when the thin film patterns 416 of the base sheet 410 are stacked to be aligned at accurate locations.

Accordingly, the stacking (S330) stacks the plurality of base sheets 410 and the adhesive sheet by using the jig 200 including the guide pin 220.

Figure 32:
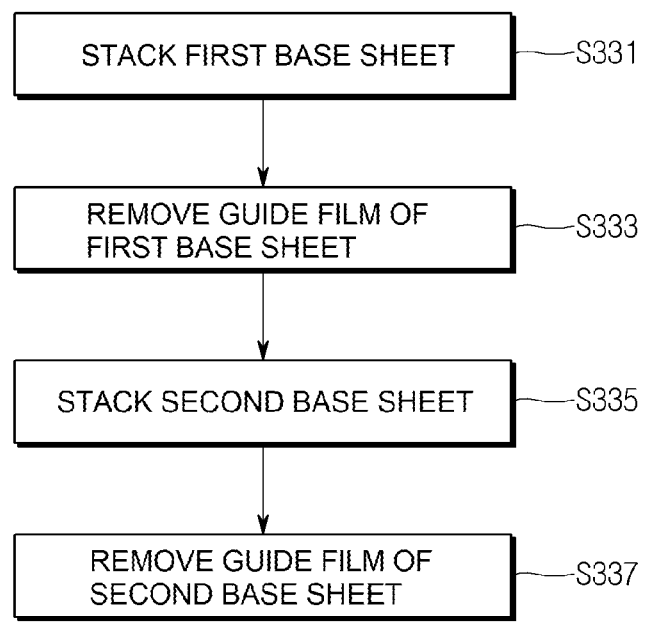
FIGS. 32 and 33 are diagrams for explaining the stacking of FIG. 24.
Figure 33:
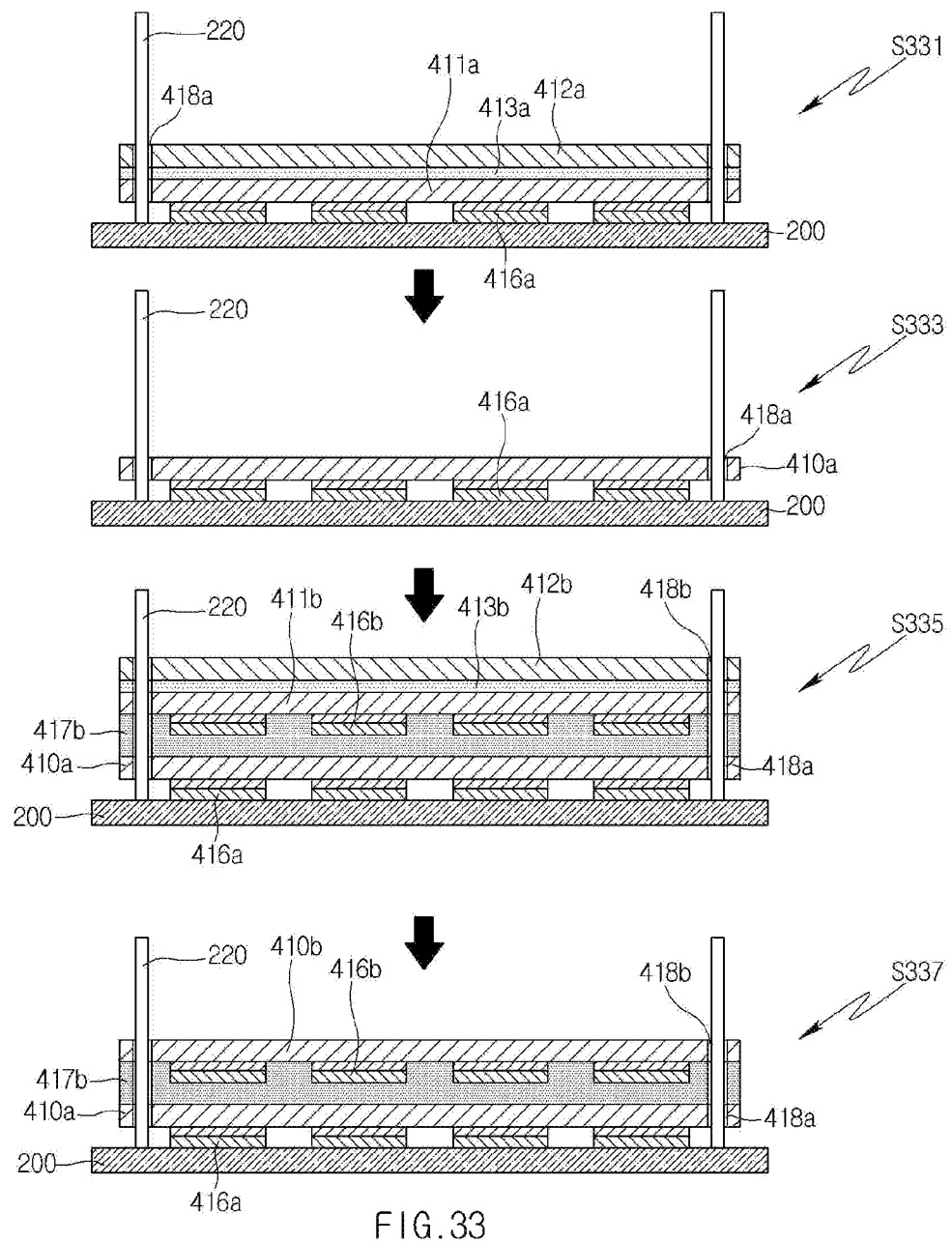

An example of the stacking (S330) that stacks two base sheets 410 (in other words, the first base sheet 410a and the second base sheet 410b) will be explained with reference to FIGS. 32 and 33 as follows.

The stacking (S330) may include stacking the first base sheet 410a (S331), removing the guide film 412a of the first base sheet 410a (S333), stacking the second base sheet 410b (S335), and removing the guide film 412b of the second base sheet 410b (S337).

The stacking the first base sheet 410a (S310) stacks the first base sheet 410a on the jig 200. In other words, the stacking the first base sheet 410a (S310) stacks the first base sheet 410a on the jig 200 by disposing so that the guide pins 220 of the jig 200 penetrate the guide holes 418a of the first base sheet 410a, respectively and then moving them downwards.

At this time, the stacking the first base sheet 410a (S310) stacks the first base sheet 410a so that the thin film pattern 416a formed on the first base sheet 410a is positioned downwards in order to easily remove the guide film 412a. In other words, the stacking the first base sheet 410a (S310) disposes the guide film 412a on the top by stacking the first base sheet 410a so that the thin film pattern 416a is positioned downwards.

The removing the guide film 412a of the first base sheet 410a (S333) removes the guide film 412a from the first base sheet 410a stacked on the jig 200. In other words, the removing the guide film 412a of the first base sheet 410a (S333) removes the guide film 412a of the first base sheet 410a disposed on the top and the adhesive film 413a.

The stacking the second base sheet 410b (S335) stacks the second base sheet 410b on the jig 200. In other words, the stacking the second base sheet 410b (S335) stacks the second base sheet 410b on the jig 200 by disposing so that the guide pins 220 of the jig 200 penetrate the guide holes 418b of the second base sheet 410b, respectively and then moving them downwards.

At this time, the stacking the second base sheet 410b (S335) stacks the second base sheet 410b above the first base sheet 410a stacked on the jig 200. The stacking the second base sheet 410b (S335) stacks the second base sheet 410b so that one surface, on which the thin film pattern 416b has been formed, is disposed above the adhesive sheet.

The removing the guide film 412b of the second base sheet 410b (S337) removes the guide film 412b from the second base sheet 410b stacked on the jig 200. In other words, the removing the guide film 412b of the second base sheet 410b (S337) removes the guide film 412b of the second base sheet 410b disposed on the top and the adhesive film 413b.

Here, in the case of a state where the adhesive layer 417 has been formed on the lower surface of the base sheet 410 and the guide film 412 has been removed, the operations S230 and S270 may be omitted.

As described above, the method for manufacturing the flexible printed circuit board may stack the plurality of base sheets 410 by disposing so that the guide pin 220 formed on the jig 200 penetrates the guide hole 418 formed in the base sheets 410 and then moving them downwards in the stacking (S330) not to perform the alignment process of the adhesive sheet in the stacking process, thereby simplifying the manufacturing process.

Further, the method for manufacturing the flexible printed circuit board may stack the plurality of base sheets 410 by disposing so that the guide pin 220 formed on the jig 200 penetrates the guide hole 418 formed in the base sheet 410 and then moving them downwards in the stacking (S330) to align the thin film patterns 416 formed on the stacked base sheets 410 at accurate locations, thereby preventing the manufacturing yield and reliability of the flexible printed circuit board from being degraded.

The adhering (S350) constitutes the stacked body by adhering the plurality of base sheets 410 and the adhesive sheet stacked on the jig 200. At this time, the adhering (S350) is, for example, to adhere the plurality of base sheets 410 included in the stacked body through a hot press process that simultaneously applies a predetermined pressure and heat. Here, since the adhesive layer 417 is made of a Teflon material, the adhering (S350) heats the stacked body at a temperature of about 300° C. or more.

The adhering (S350) separates the stacked body from the jig 200 when the plurality of base sheets 410 are completely adhered to constitute the stacked body.

The forming the via hole (S370) forms one or more via holes 420 penetrating the stacked body. In other words, the forming the via hole (S370) forms the via hole 420 in the stacked body separated from the jig 200 through a punching process, a laser drill process, or the like.

Here, although it has been illustrated in FIGS. 24 and 25 that the plurality of base sheets 410 and the adhesive sheet are stacked and adhered to each other and then the via hole 420 is formed, it is not limited thereto and the respective base sheets 410 and adhesive sheet may also be stacked and adhered to each other after the via hole 420 is formed.

The forming the connection pattern (S390) forms the connection pattern 430 in the via hole 420 in order to electrically connect (in other words, electrically conduct) the thin film patterns 416 formed on the plurality of base sheets 410, respectively. At this time, the forming the connection pattern (S390) forms the connection pattern 430 by filling a conductive material in the via hole 420. Here, the forming the connection pattern (S390) may also form the connection pattern 430 by electroplating the conductive material on the inner wall surface of the via hole 420 and the thin film pattern 416 exposed to the outside of the stacked body.

Meanwhile, the method for manufacturing the flexible printed circuit board may further include forming a protective layer on the upper surface of the stacked body configured by stacking the plurality of base sheets 410.

The forming the protective layer forms a protective layer covering the surfaces of the thin film pattern 416 and the base sheet 410 by applying and then curing a coating liquid to the surfaces of the base sheet 410 stacked on the uppermost portion of the stacked body and the thin film pattern 416. At this time, the protective layer may be made of a composite material containing a resin such as polypropylene and polyimide.

Further, the method for manufacturing the flexible printed circuit board may further include forming an electrode part. At this time, the forming the electrode part may form the electrode part by removing a part of the protective layer and then plating a conductive material such as copper on the corresponding area. Here, the electrode part may be formed on at least one of the plurality of thin film patterns 416 disposed on the upper surface of the stacked body.

Figure 34:
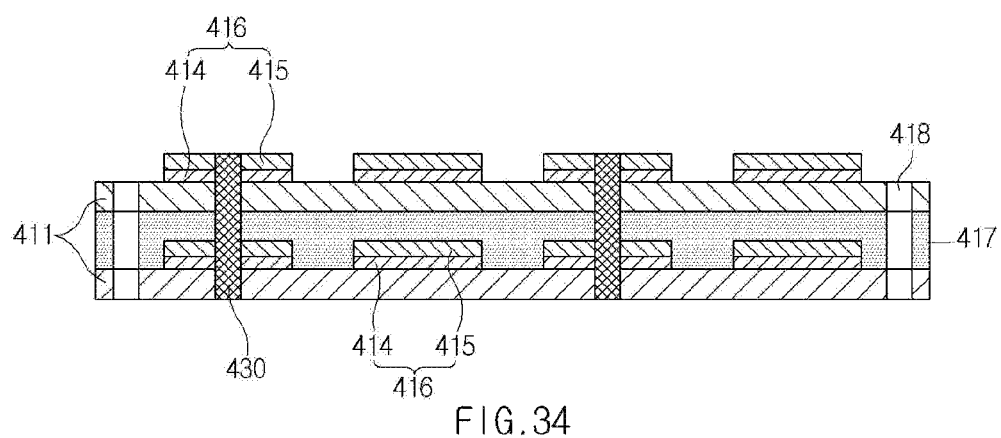
FIG. 34 is a diagram for explaining a flexible printed circuit board according to the third embodiment of the present disclosure.

Referring to FIG. 34, the flexible printed circuit board according to the third embodiment of the present disclosure is configured to include a stacked body in which the plurality of base sheets 410 are stacked and then adhered to each other, and a circuit pattern formed in the stacked body and on the upper surface thereof.

The base sheet 410 is composed of the Teflon film 411 having the thin film pattern 416 formed on one surface thereof. At this time, the thin film pattern 416 is composed of the seed layer 414 formed on the surface of the Teflon film 411 and the plating layer 415 formed on the upper surface of the seed layer 414.

The base sheet 410 includes the adhesive layer 417 formed on at least one surface of the upper surface and the lower surface of the Teflon film 411. At this time, the adhesive layer 417 may be formed only on one surface of the Teflon film 411 adhered to another base sheet 410, or formed on both surfaces of the Teflon film 411.

The adhesive layer 417 is, for example, a Teflon material, and is formed on the surface of the Teflon film 411 through an impregnation coating or printing (for example, gravure, spray, or the like) process.

As the plurality of base sheets 410 is configured by being stacked, some areas of the stacked body are formed in a structure in which the Teflon film 411 and the adhesive layer 417 have been alternately stacked, and the remaining areas are formed in a structure in which the Teflon film 411, the thin film pattern 416, and the adhesive layer 417 have been alternately stacked.

The circuit pattern is composed of the thin film pattern 416 exposed to the upper surface of the stacked body, the thin film pattern 416 interposed in the stacked body, and the connection pattern 430 electrically connecting the thin film patterns 416.

In other words, as the base sheets 410 are stacked, the circuit pattern has the thin film pattern 416, which has been formed on the base sheet 410 stacked on the uppermost portion thereof, exposed to the upper surface of the stacked body, and has the thin film patterns 416 formed on the other base sheets 410 interposed in the stacked body. At this time, the thin film patterns 416 are electrically connected (in other words, electrically conducted) through the connection pattern 430 formed in the via hole 420.

Here, although it has been illustrated in FIG. 34 that the connection pattern 430 is formed by being filled in the via hole 420, it is not limited thereto and may also be formed by being plated on the inner wall surface of the via hole 420.

As described above, although preferred embodiments according to the present disclosure has been described, it may be modified in various forms, and it is understood by those skilled in the art that various modified examples and changed examples may be practiced without departing from the claims of the present disclosure.

The invention claimed is:

1. A method for manufacturing a flexible printed circuit board, comprising: preparing a base sheet, which is a Teflon film having a thin film pattern formed thereon; forming a surface reformed layer on the upper surface and the periphery of the thin film pattern; stacking a plurality of base sheets; and heating, pressing, and adhering a stacked body in which the plurality of base sheets have been stacked.

2. The method for manufacturing the flexible printed circuit board of claim 1, wherein the preparing the base sheet comprises adhering a guide film on one surface of the Teflon film; forming a thin film pattern on the other surface of the Teflon film; and forming one or more via holes penetrating the Teflon film, the guide film, and the thin film pattern.

3. The method for manufacturing the flexible printed circuit board of claim 2, wherein the adhering the guide film interposes a silicon-based adhesive film between the Teflon film and the guide film.

4. The method for manufacturing the flexible printed circuit board of claim 1, further comprising preliminarily adhering the stacked body by applying a water pressure to the stacked body before the adhering.

5. The method for manufacturing the flexible printed circuit board of claim 1, further comprising: forming a via hole in the stacked body after the adhering; and forming a connection pattern in the via hole.

6. The method for manufacturing the flexible printed circuit board of claim 1, wherein the preparing the base sheet prepares the Teflon film having a surface reformed layer formed thereon as the base sheet.

7. The method for manufacturing the flexible printed circuit board of claim 6, wherein the preparing the base sheet comprises adhering a guide film to one surface of the Teflon film; forming a thin film pattern on the other surface of the Teflon film; and forming the surface reformed layer on the other surface of the Teflon film.

8. The method for manufacturing the flexible printed circuit board of claim 7, wherein the preparing the base sheet further comprises removing the guide film; and forming the surface reformed layer on one surface of the Teflon film.

9. The method for manufacturing the flexible printed circuit board of claim 1, wherein the preparing the base sheet comprises forming a surface reformed layer on at least one surface of one surface and the other surface of the Teflon film; adhering a guide film on one surface of the Teflon film; and forming a thin film pattern on the other surface of the Teflon film.

10. The method for manufacturing the flexible printed circuit board of claim 1, wherein the preparing the base sheet prepares the Teflon film having an adhesive layer of a Teflon material formed thereon as the base sheet.

11. The method for manufacturing the flexible printed circuit board of claim 10, wherein the preparing the base sheet comprises adhering a guide film on one surface of the Teflon film; forming a thin film pattern on the other surface of the Teflon film; and forming an adhesive layer on the other surface of the Teflon film.

12. The method for manufacturing the flexible printed circuit board of claim 11, wherein the forming the adhesive layer forms the adhesive layer on the upper surface and the periphery of the thin film pattern and an area where the thin film pattern has not been formed.

13. The method for manufacturing the flexible printed circuit board of claim 11, wherein the preparing the base sheet further comprises removing the guide film; and forming a coating layer on one surface of the Teflon film.

14. A flexible printed circuit board, comprising: a stacked body in which a plurality of base sheets have been stacked; and a circuit pattern formed on the stacked body, wherein the base sheet comprises a Teflon film having a thin film pattern formed thereon; and wherein the thin film pattern has a surface reformed layer formed on the upper surface and the periphery thereof.

15. The flexible printed circuit board of claim 14, wherein the Teflon film has an adhesive layer formed on one surface adhered to another base sheet, and wherein the adhesive layer is a Teflon material.

16. The flexible printed circuit board of claim 14, wherein the Teflon film has a surface reformed layer formed thereon, and wherein the surface reformed layer is formed on one surface of the Teflon film having the thin film pattern formed thereon.

17. The flexible printed circuit board of claim 16, wherein the surface reformed layer is formed on an area, which has been exposed to a spacing space of the thin film pattern, of one surface of the Teflon film.

18. The flexible printed circuit board of claim 14, further comprising an adhesive sheet stacked between the plurality of base sheets, wherein the adhesive sheet is a Casted polypropylene (CPP) film of a multilayer structure having an adhesive layer formed on at least one surface thereof, or an adhesive film of a single layer structure comprising at least one among polyethylene, polypropylene, and polyimide.

19. The flexible printed circuit board of claim 14, wherein the circuit pattern comprises a plurality of thin film patterns formed on one surface of the Teflon film and disposed in the stacked body and on the upper surface thereof; and a connection pattern connecting the plurality of thin film patterns.

* * * * *